(12) United States Patent
Horiuchi et al.

(10) Patent No.: US 8,138,609 B2
(45) Date of Patent: Mar. 20, 2012

(54) SEMICONDUCTOR DEVICE AND METHOD OF MANUFACTURING SEMICONDUCTOR DEVICE

(75) Inventors: Michio Horiuchi, Nagano (JP); Yasue Tokutake, Nagano (JP); Yuichi Matsuda, Nagano (JP); Tomoo Yamasaki, Nagano (JP); Yuta Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 123 days.

(21) Appl. No.: 12/832,177

(22) Filed: Jul. 8, 2010

(65) Prior Publication Data

US 2011/0012266 A1    Jan. 20, 2011

(30) Foreign Application Priority Data

Jul. 17, 2009   (JP) ................. 2009-168596

(51) Int. Cl.
*H01L 23/48* (2006.01)

(52) U.S. Cl. ...................... 257/773; 438/111
(58) Field of Classification Search .............. 257/773; 438/111, 123
See application file for complete search history.

(56) References Cited

U.S. PATENT DOCUMENTS

| | | | |
|---|---|---|---|
| 4,463,084 A | 7/1984 | Mitsumori et al. | |
| 6,093,476 A | 7/2000 | Horiuchi et al. | |
| 6,221,690 B1 * | 4/2001 | Taniguchi et al. | 438/106 |
| 6,501,115 B2 * | 12/2002 | Yoshida et al. | 257/296 |
| 6,507,497 B2 * | 1/2003 | Mashino | 361/767 |
| 6,620,650 B2 * | 9/2003 | Nakata et al. | 438/107 |
| 7,239,014 B2 * | 7/2007 | Ogawa et al. | 257/700 |

FOREIGN PATENT DOCUMENTS

| | | |
|---|---|---|
| JP | 58-137915 | 8/1983 |
| JP | 58-141595 | 8/1983 |
| JP | 10-308565 | 11/1998 |
| JP | 2004-273480 | 9/2004 |
| JP | 2009-147241 | 7/2009 |

* cited by examiner

*Primary Examiner* — Thao Le
(74) *Attorney, Agent, or Firm* — IPUSA, PLLC

(57) ABSTRACT

In a semiconductor device, a substrate includes a plurality of line conductors which penetrate the substrate from a top surface to a bottom surface of the substrate. A semiconductor chip is secured in a hole of the substrate. A first insulating layer is formed on the top surfaces of the substrate and the semiconductor chip. A first wiring layer is formed on the first insulating layer and electrically connected via through holes of the first insulating layer to the semiconductor chip and some line conductors exposed to one of the through holes. A second insulating layer is formed on the bottom surfaces of the substrate and the semiconductor chip. A second wiring layer is formed on the second insulating layer and electrically connected via a through hole of the second insulating layer to some line conductors exposed to the through hole.

10 Claims, 19 Drawing Sheets

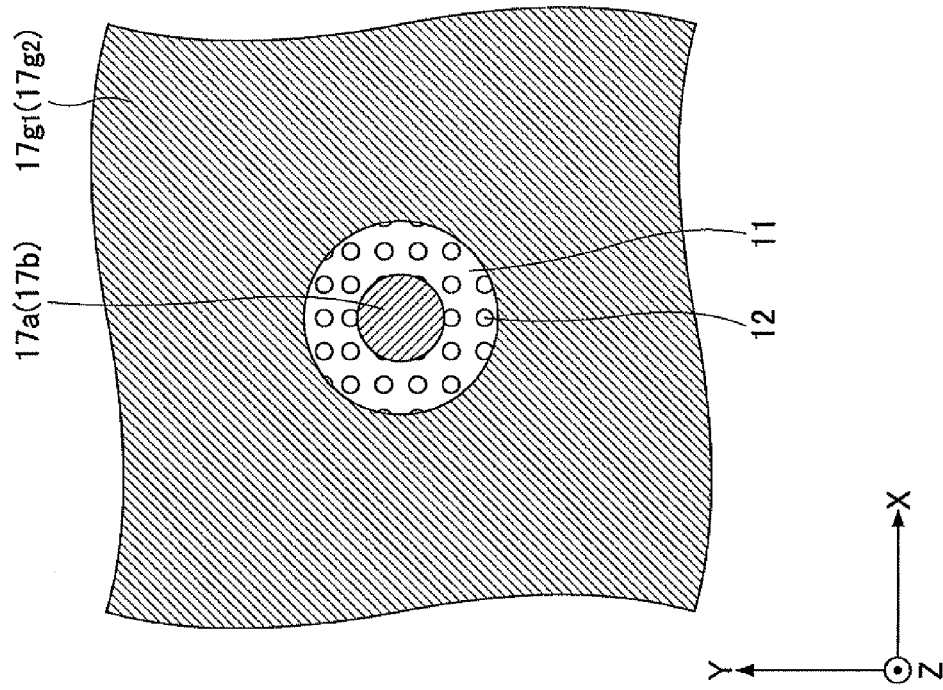
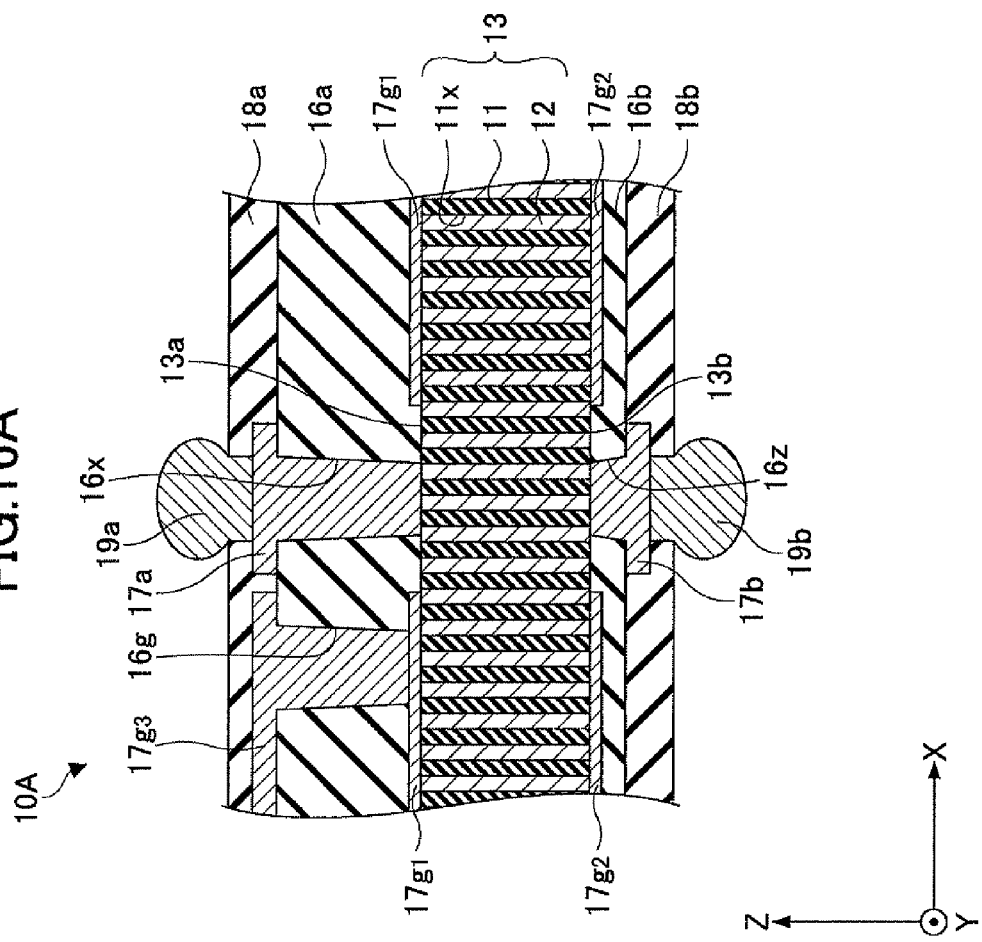

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority of Japanese patent application No. 2009-168596, filed on Jul. 17, 2009, the entire contents of which are incorporated herein by reference in their entirety.

BACKGROUND OF THE INVENTION

1. Field of the Invention

This invention relates to a semiconductor device containing a semiconductor chip and a substrate, and relates to a method of manufacturing a semiconductor device containing a semiconductor chip and a substrate.

2. Description of the Related Art

Conventionally, a semiconductor device in which a semiconductor chip is mounted on a substrate is known. Referring to FIG. 1, a semiconductor device according to the related art in which a semiconductor chip is mounted on a substrate will be described.

FIG. 1 is a cross-sectional view of a semiconductor device according to the related art in which a semiconductor chip is mounted on a substrate. As illustrated in FIG. 1, the semiconductor device 300 includes a multi-layer substrate 500, a semiconductor chip 400, solder bumps 410, and an underfill resin layer 420. A support medium 510 is formed in the central part of the multi-layer substrate 500.

A first wiring layer 610a is formed on a first principal surface 510a of the supporting medium 510. A through via 690 is formed in the supporting medium 510 to penetrate the supporting medium 510 from the first principal surface 510a to a second principal surface 510b thereof. The first wiring layer 610a is electrically connected to a fourth wiring layer 610b (which will be described later) through the through via 690. A first insulating layer 520a is formed to cover the first wiring layer 610a, and a second wiring layer 620a is formed on the first insulating layer 520a. The first wiring layer 610a and the second wiring layer 620a are electrically connected to each other through via holes 520x which penetrate the first insulating layer 520a.

A second insulating layer 530a is formed to cover the second wiring layer 620a. A third wiring layer 630a is formed on the second insulating layer 530a. The second wiring layer 620a and the third wiring layer 630a are electrically connected to each other through via holes 530x which penetrate the second insulating layer 530a.

A solder-resist film 550a which has an opening 550x is formed to cover the third wiring layer 630a. The portion of the third wiring layer 630a, exposed from the opening 550x of the solder-resist film 550a, serves as an electrode pad. In the following, the portion of the third wiring layer 630a exposed from opening 550x of the solder-resist film 550a will be referred to as an electrode pad 630a. In the following, the surface on which the electrode pad 630a is formed will be referred to as a first principal surface of the multi-layer substrate 500.

On the second principal surface 510b of the supporting medium 510, a fourth wiring layer 610b is formed. A third insulating layer 520b is formed to cover the fourth wiring layer 610b. A fifth wiring layer 620b is formed on the third insulating layer 520b. The fourth wiring layer 610b and the fifth wiring layer 620b are electrically connected to each other through via holes 520y which penetrate the third insulating layer 520b.

A fourth insulating layer 530b is formed to cover the fifth wiring layer 620b. A sixth wiring layer 630b is formed on the fourth insulating layer 530b. The fifth wiring layer 620b and the sixth wiring layer 630b are electrically connected to each other through via holes 530y which penetrate the fourth insulating layer 530b.

A solder-resist film 550b which has an opening 550y is formed to cover the sixth wiring layer 630b. The portion of the sixth wiring layer 630b, exposed from the opening 550y of the solder-resist film 550b, serves as an electrode pad. In the following, the portion of the sixth wiring layer 630b exposed from the opening 550y of the solder-resist film 550b will be referred to as an electrode pad 630b. In the following, the surface on which the electrode pad 630b is formed will be referred to as a second principal surface of the multi-layer substrate 500.

Solder bumps 680 are formed on some electrode pads 630b. When mounting the semiconductor device 300 on a circuit board (not illustrated), each solder bump 680 serves as an external connection terminal that is electrically connected to a corresponding terminal of the circuit board. Chip capacitors 100 are mounted on some electrode pads 630b. One of such electrode pads 630b and external electrodes 260a and 260b of each chip capacitor 100 are connected electrically to each other.

A semiconductor chip 400 is mounted on the first principal surface of the multi-layer substrate 500. In the semiconductor chip 400, a semiconductor integrated circuit (not illustrated) and electrode pads (not illustrated) are formed on a thinned semiconductor substrate (not illustrated) which is made of silicon or the like. The solder bumps 410 are formed on the electrode pads (not illustrated) of the semiconductor chip 400.

The electrode pads (not illustrated) of the semiconductor chip 400 are electrically connected to the corresponding electrode pads 630a of the multi-layer substrate 500 by the solder bumps 410. Examples of the material of the solder bumps 410 may include an alloy of Sn and Cu, an alloy of Sn and Ag, and an alloy of Sn, Ag and Cu. The underfill resin layer 420 is formed between the semiconductor chip 400 and the solder-resist film 550a of the multi-layer substrate 500.

Conventionally, a semiconductor device in which a semiconductor chip is built in a substrate is known. Referring to FIG. 2, a semiconductor device according to the related art in which a semiconductor chip is built in a substrate will be described.

FIG. 2 is a cross-sectional view of a semiconductor device according to the related art in which a semiconductor chip is built in a substrate. As illustrated in FIG. 2, the semiconductor device 700 includes a multi-layer substrate 800 and a semiconductor chip 450. The semiconductor chip 450 is embedded in a resin 810. A first insulating layer 820 is formed on one surface of the semiconductor chip 450 and the resin 810, and a first wiring layer 910 is formed on the first insulating layer 820. The first wiring layer 910 and electrode pads (not illustrated) of the semiconductor chip 450 are electrically connected to each other through via holes 820x which penetrate the first insulating layer 820. Namely, bumps are not used to electrically connect the semiconductor chip 450 and the multi-layer substrate 800.

A second insulating layer 830 is formed to cover the first wiring layer 910, and a second wiring layer 920 is formed on the second insulating layer 830. The first wiring layer 910 and the second wiring layer 920 are electrically connected to each other through via holes 830x which penetrate the second insulating layer 830.

A third insulating layer 840 is formed to cover the second wiring layer 920. A third wiring layer 930 is formed on the third insulating layer 840. The second wiring layer 920 and the third wiring layer 930 are electrically connected to each other through via holes 840x which penetrate the third insulating layer 840.

A solder-resist film 850 which has an opening 850x is formed to cover the third wiring layer 930. The portion of the third wiring layer 930, exposed from the opening 850x of the solder-resist film 850, serves as an electrode pad. In the following, the portion of the third wiring layer 930 exposed from the opening 850x of the solder-resist film 850 will be referred to as an electrode pad 930. Solder bumps 980 are formed on the electrode pads 930. When mounting the semiconductor device 700 on a circuit board (not illustrated), each solder bump 980 serves as an external connection terminal that is electrically connected to a corresponding terminal of the circuit board.

Japanese Laid-Open Patent Publication No. 10-308565 discloses a semiconductor device using a wiring board having a wiring pattern formed on a surface of a core substrate. In this semiconductor device, a semiconductor chip is mounted on the wiring board or built in the wiring board.

However, in the semiconductor device 300 in which the semiconductor chip is mounted on the substrate, there is a problem in that the reliability of the connection at the portions of the solder bumps 410 where the semiconductor chip 400 and the multi-layer substrate 500 are electrically connected is low. Specifically, stress destruction may occur due to the difference in the coefficient of thermal expansion between the semiconductor chip 400 and the multi-layer substrate 500, or disconnection may occur due to electro-migration or the like.

Unlike the semiconductor device 300, the semiconductor device 700 in which the semiconductor chip is built in the substrate does not use the bumps to electrically connect the semiconductor chip 450 and the multi-layer substrate 800, and may have an improved reliability of the connection of the semiconductor chip 450 and the multi-layer substrate 800. However, in the case of the semiconductor device 700, after the semiconductor chip 450 is embedded in the resin 810, the first wiring layer 910 is formed on the surface of the resin 810. The wiring layers which are mutually connected to each other cannot be formed on the top and bottom surfaces of the semiconductor chip 450. Hence, it is difficult to attain high-density fabrication of the semiconductor device 700.

SUMMARY OF THE INVENTION

In one aspect of the invention, the present disclosure provides a semiconductor device and a semiconductor device manufacturing method which are adapted to attain highly reliable connection of the semiconductor chip and the substrate and high-density fabrication of the semiconductor device.

In an embodiment of the invention which solves or reduces one or more of the above-described problems, the present disclosure provides a semiconductor device which includes: a substrate having a plurality of line conductors which penetrate the substrate from a top surface of the substrate to a bottom surface of the substrate; a semiconductor chip secured in a semiconductor-chip accommodating hole of the substrate; a first insulating layer formed on the top surface of the substrate and on a top surface of the semiconductor chip; a first wiring layer formed on the first insulating layer, the first wiring layer in a first through hole of the first insulating layer being electrically connected to the semiconductor chip, and the first wiring layer in a second through hole of the first insulating layer being electrically connected to some of the plurality of line conductors exposed to the second through hole of the first insulating layer; a second insulating layer formed on the bottom surface of the substrate and on a bottom surface of the semiconductor chip; and a second wiring layer formed on the second insulating layer, the second wiring layer in a through hole of the second insulating layer being electrically connected to some of the plurality of line conductors exposed to the through hole of the second insulating layer.

In an embodiment of the invention which solves or reduces one or more of the above-described problems, the present disclosure provides a semiconductor device manufacturing method which includes: preparing a substrate including a plurality of line conductors which penetrate the substrate from a top surface of the substrate to a bottom surface of the substrate; forming a semiconductor-chip accommodating hole in the substrate; forming a first insulating layer on a top surface of the substrate to block an end of the semiconductor-chip accommodating hole; securing a semiconductor chip in the semiconductor-chip accommodating hole so that a top surface of the semiconductor chip is in contact with the first insulating layer; forming a first wiring layer on the first insulating layer, the first wiring layer in a first through hole of the first insulating layer being electrically connected to the semiconductor chip, and the first wiring layer in a second through hole of the first insulating layer being electrically connected to some of the plurality of line conductors exposed to the second through hole of the first insulating layer; forming a second insulating layer on a bottom surface of the substrate to block the other end of the semiconductor-chip accommodating hole; and forming a second wiring layer on the second insulating layer, the second wiring layer in a through hole of the second insulating layer being electrically connected to some of the plurality of line conductors exposed to the through hole of the second insulating layer.

Other objects, features and advantages of the invention will be apparent from the following detailed description when read in conjunction with the accompanying drawings.

BRIEF DESCRIPTION OF THE DRAWINGS

FIG. 16A and FIG. 16B are diagrams for explaining a modification of the semiconductor device of the first embodiment.

DETAILED DESCRIPTION OF PREFERRED EMBODIMENTS

A description will now be given of embodiments of the present disclosure with reference to the accompanying drawings.

Figure 1:
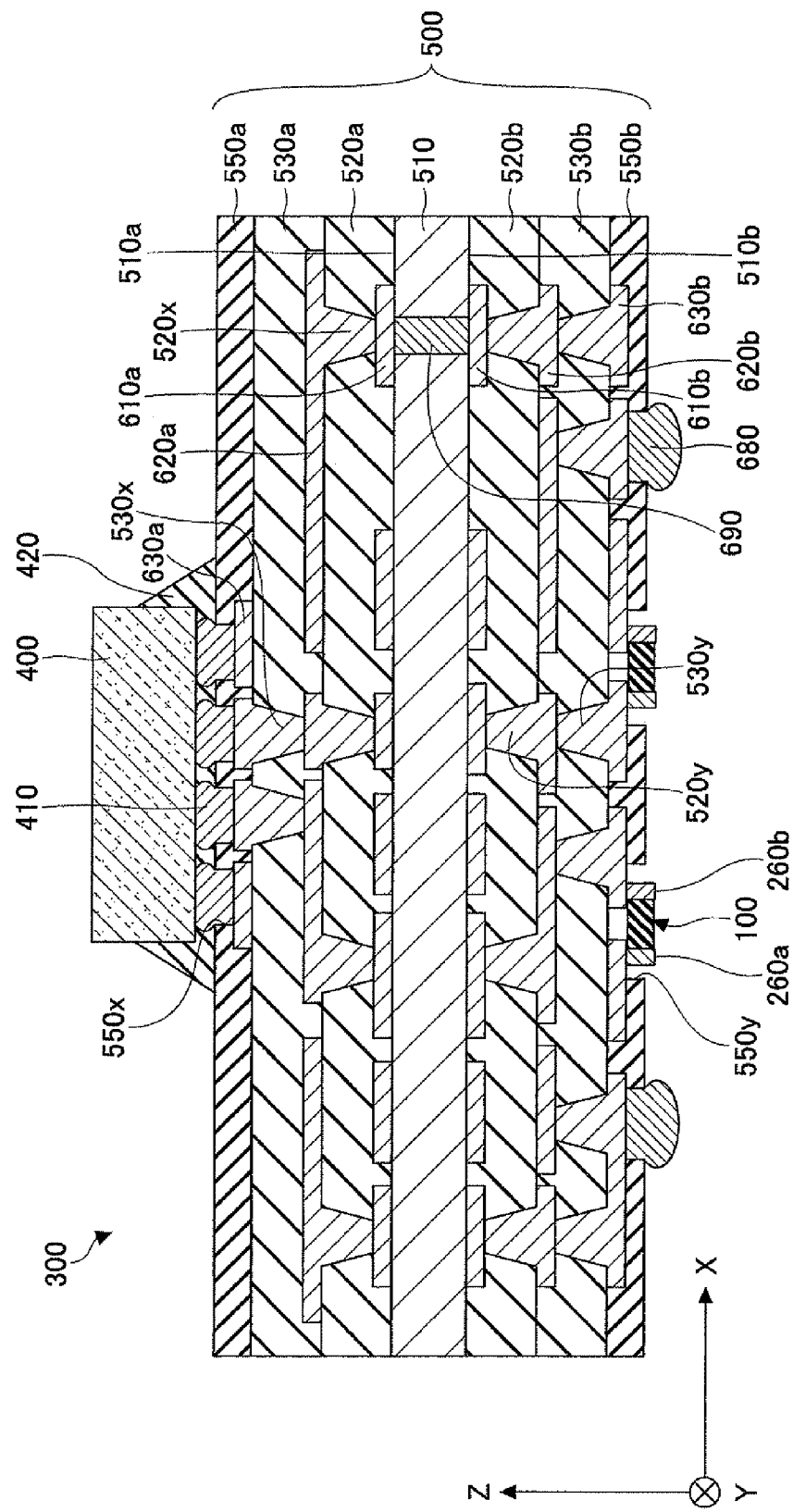
FIG. 1 is a cross-sectional view of a semiconductor device according to the related art in which a semiconductor chip is mounted on a substrate.
Figure 2:
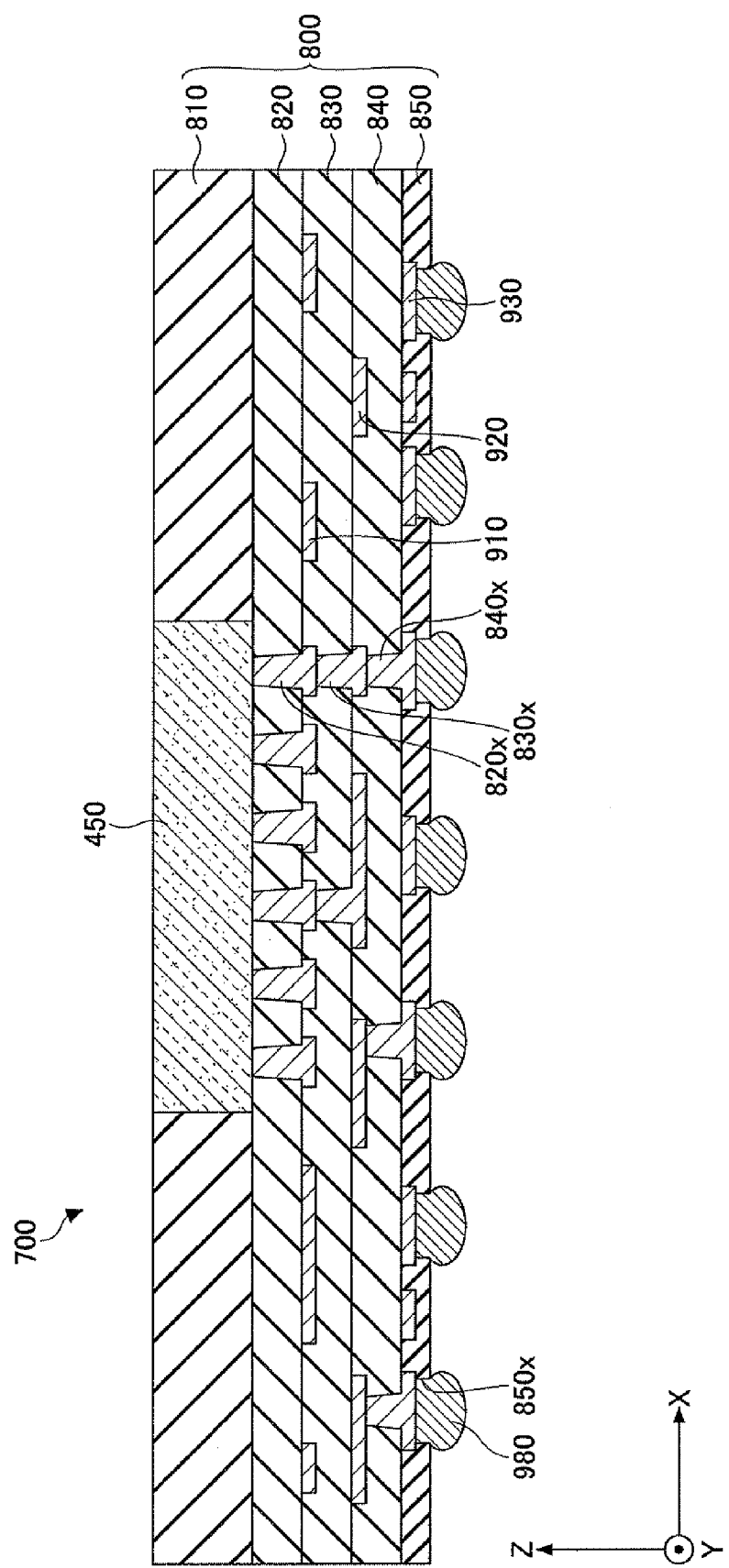
FIG. 2 is a cross-sectional view of a semiconductor device according to the related art in which a semiconductor chip is built in a substrate.
Figure 3:
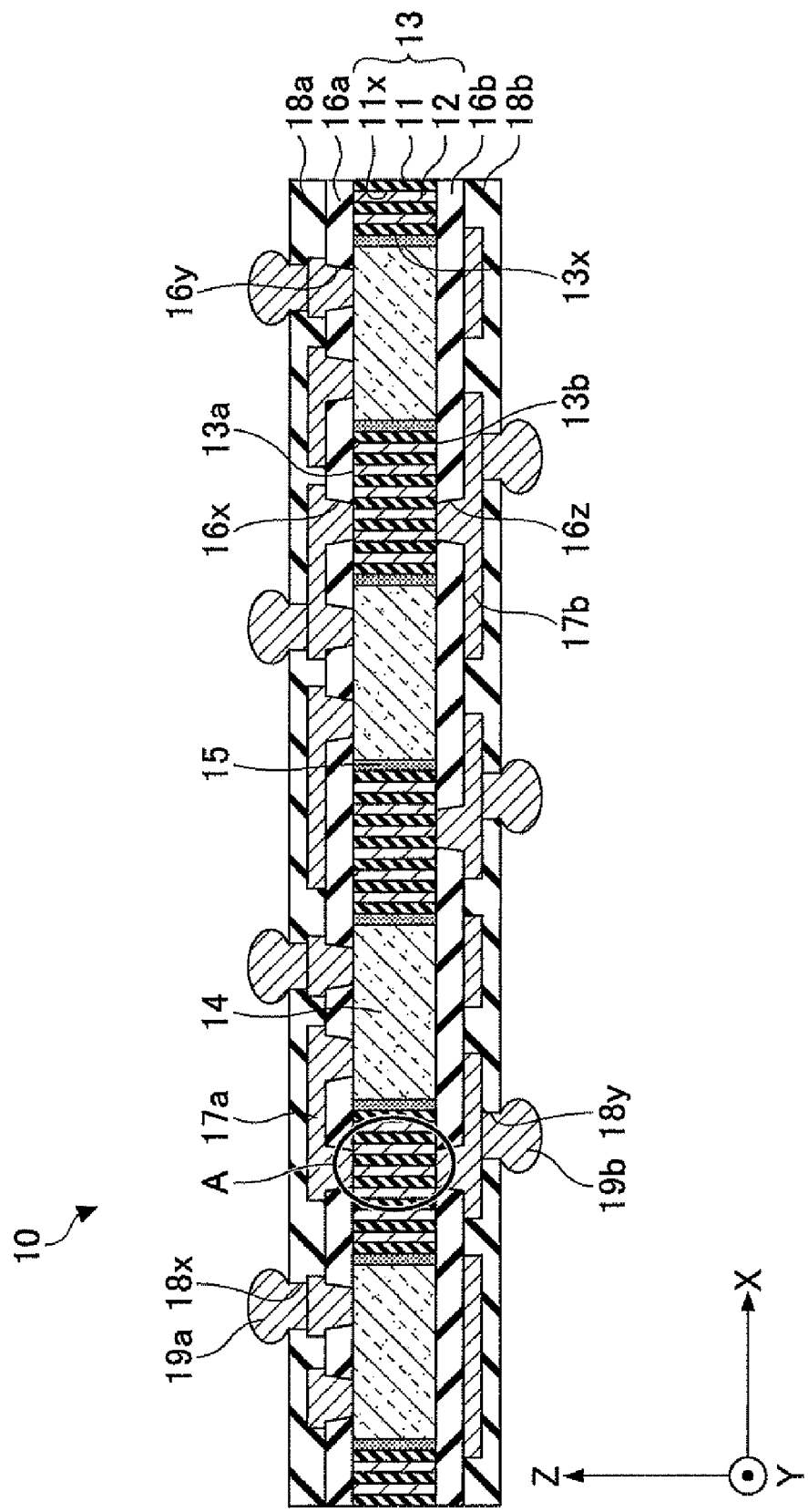
FIG. 3 is a cross-sectional view of a semiconductor device of a first embodiment of the present disclosure.
Figure 4:
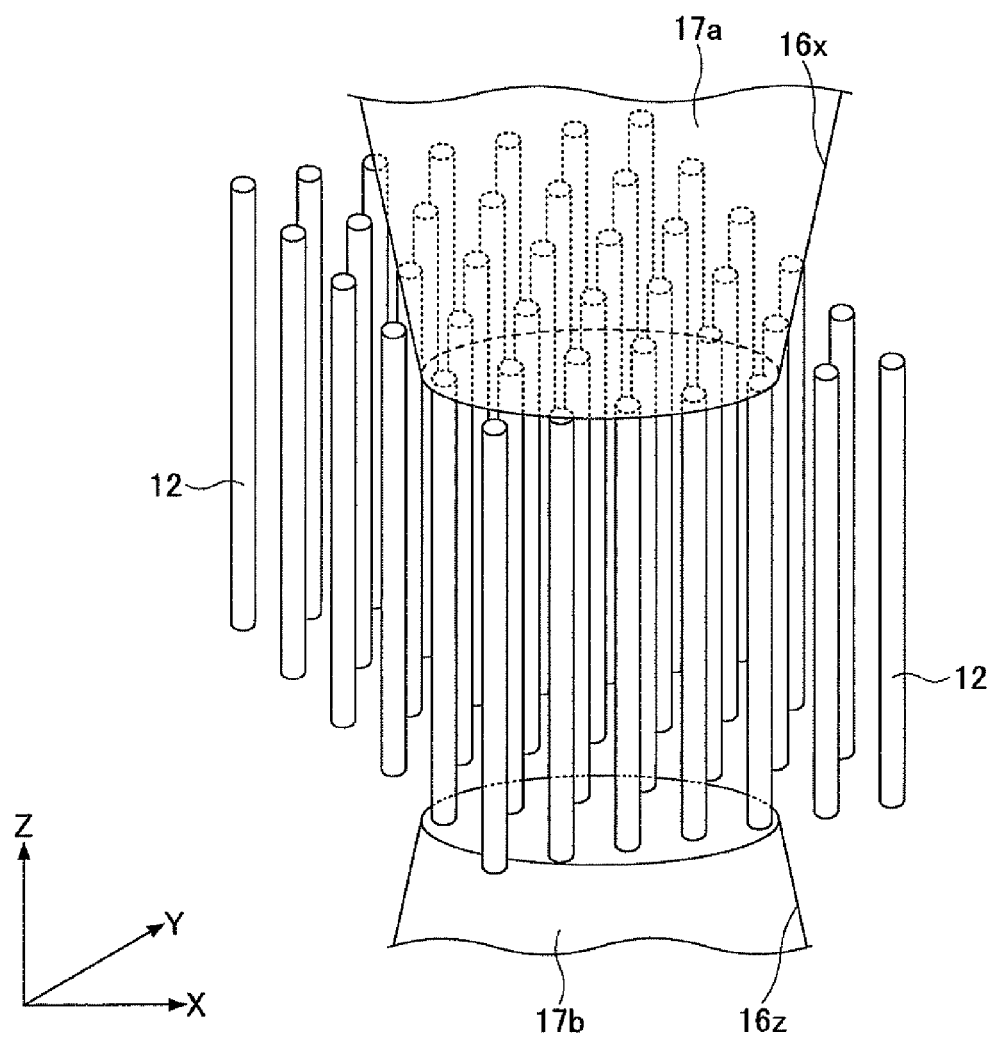
FIG. 4 is an enlarged perspective diagram of the portion A of the semiconductor device of the first embodiment illustrated in FIG. 3.

The structure of a semiconductor device of a first embodiment of the present disclosure will be described. FIG. 3 is a cross-sectional view of the semiconductor device of the first embodiment. FIG. 4 is an enlarged perspective diagram of the portion A of the semiconductor device of the first embodiment illustrated in FIG. 3. In FIG. 4, illustration of some components of the semiconductor device in FIG. 3 is omitted.

In FIG. 3 and FIG. 4, the direction X indicates a direction which is parallel to one surface 13a of a substrate 13 (which will be described below), the direction Y indicates a direction (or a width direction of the substrate 13) which is perpendicular to the direction X and parallel to one surface 13a of the substrate 13, and the direction Z indicates a direction (or a thickness direction of the substrate 13) which is perpendicular to both the direction X and the direction Y.

As illustrated in FIG. 3 and FIG. 4, the semiconductor device 10 of the first embodiment includes a substrate 13, a semiconductor chip 14, an insulating resin 15, a first insulating layer 16a, a second insulating layer 16b, a first wiring layer 17a, a second wiring layer 17b, a first solder resist layer 18a, a second solder resist layer 18b, a first solder bump 19a, and a second solder bump 19b.

In the semiconductor device 10, the substrate 13 is, for example, a substrate having a thickness in a range of 70-100 micrometers and a size of about 10×10 mm. This substrate 13 includes an insulating base material 11 in which a large number of through holes 11x extending in the direction Z (the thickness direction) are formed in the whole area thereof, and these through holes 11x are filled up with a metallic material to form a large number of line conductors (vias) 12. Examples of the insulating base material 11 may include alumina (aluminum oxide), mullite, aluminum nitride, crystallized glass (a composite material of glass and ceramics), etc. Alternatively, an organic resin (epoxy resin, polyimide resin, etc.) may be used as a material of the insulating base material 11.

When the semiconductor chip 14 to be built in the substrate 13 is made of silicon, the coefficient of thermal expansion (CTE) thereof is about 3 ppm/degree C. When the first wiring layer 17a and the second wiring layer 17b to be formed in the substrate 13 are made of copper (Cu), the coefficient of thermal expansion (CTE) thereof is about 16-17 ppm/degree C. If a ceramic material having an intermediate value of the coefficient of thermal expansion (CTE) between the value of the coefficient of thermal expansion (CTE) of the semiconductor chip 14 and the value of the coefficient of thermal expansion (CTE) of the first wiring layer 17a or the second wiring layer 17b, such as alumina whose coefficient of thermal expansion (CTE) is about 6-7 ppm/degree C., or mullite whose coefficient of thermal expansion (CTE) is about 4.5 ppm/degree C., is used as the material of the insulating base material 11, it is possible to reduce the stress due to the difference in the coefficient of thermal expansion (CTE) between the semiconductor chip 14 and the first and second wiring layers 17a and 17b.

If an organic resin (epoxy resin, polyimide resin, etc.) is used as a material of the insulating base material 11 and mixed with an inorganic filler, such as silica, with high density, it is possible to make the organic resin have an intermediate value of the coefficient of thermal expansion (CTE) between the value of the coefficient of thermal expansion (CTE) of the semiconductor chip 14 and the value of the coefficient of thermal expansion (CTE) of the first wiring layer 17a or the second wiring layer 17b. Hence, it is possible to reduce the stress due to the difference in the coefficient of thermal expansion (CTE) between the semiconductor chip 14 and the first and second wiring layers 17a and 17b.

One end surface of each line conductor 12 is exposed from the surface 13a of the substrate 13, and the other end surface of each line conductor 12 is exposed from the opposite surface 13b of the substrate 13. For example, each line conductor 12 is formed to have a circular cross-section, and the diameter of each line conductor 12 is in a range of 30 nm-2000 nm. In this case, each line conductor 12 has a circular cross-section when viewed from the direction Z of FIG. 3.

It is preferred that a large number of line conductors 12 are densely formed to make the spacing between two adjacent line conductors 12 smaller than the diameter of each line conductor 12. However, the arrangement of the line conductors 12 may not be limited to a specific embodiment. The line conductors 12 may be arranged in a hexagonal formation, or in a grid-like formation.

Each of the line conductors 12 in this embodiment serves as a via which electrically connects the conductor formed on the surface 13a of the substrate 13 and the conductor formed on the other surface 13b of the substrate 13. Alternatively, some of the line conductors 12 may be arranged in a floating state so that such line conductors 12 are not connected to any conductor on the substrate 13 and electrically isolated. Examples of the metallic material to form the line conductors (vias) 12 may include silver (Ag), copper (Cu), nickel (Ni), etc.

The semiconductor chip 14 is secured in a through hole 13x of the substrate 13 by the insulating resin 15. This through hole 13x is a semiconductor-chip accommodating hole for the semiconductor chip 14 and formed in the substrate 13. The semiconductor chip 14 includes a semiconductor integrated circuit (not illustrated) and electrode pads (not illustrated) which are formed on a thinned semiconductor substrate of silicon or the like (not illustrated). For example, the semiconductor chip 14 has a thickness in a range of 10-50 micrometers. Examples of the material of the insulating resin 15 may include an epoxy resin, a polyimide resin, etc. The semiconductor chip 14 is arranged so that the semiconductor integrated circuit (not illustrated) and the electrode pads (not illustrated) on the semiconductor chip 14 face to the top surface side of the substrate 13 (or the side in contact with the first insulating layer 16a).

The first insulating layer 16a is formed on the top surface of the semiconductor chip 14 (or the surface on which the electrode pads (not illustrated) are formed) and on the surface 13a of the substrate 13. Examples of the material of the first insulating layer 16a may include a resin material, such as an epoxy resin or a polyimide resin.

The first wiring layer 17a is formed on the first insulating layer 16a. The first wiring layer 17a formed in a first via hole 16x of the first insulating layer 16a is electrically connected to the end faces of various line conductors 12 which are exposed to the first via hole 16x. For example, if the diameter of the bottom of the first via hole 16x is set to about 100 micrometers, the first wiring layer 17a would be electrically connected to the end faces of thousands of line conductors 12. The first wiring layer 17a formed in a second via hole 16y of the first insulating layer 16a is electrically connected to the electrode pads (not illustrated) of the semiconductor chip 14 which are exposed to the second via hole 16y. Examples of the material of the first wiring layer 17a may include copper (Cu), etc.

The first solder resist layer 18a is formed on the first insulating layer 16a to cover the first wiring layer 17a. The first solder resist layer 18a has an opening 18x and a part of the first wiring layer 17a is exposed to the opening 18x.

The first solder bump 19a is formed on the first wiring layer 17a which is exposed to the opening 18x of the first solder resist layer 18a. Examples of the material of the first solder bump 19a may include an alloy containing Pb, an alloy of Sn and Cu, an alloy of Sn and Ag, an alloy of Sn, Ag and Cu, etc. For example, the first solder bump 19a serves as an external connection terminal which is connected to the mother board or the like.

Alternatively, a metallic pin or the like may be used as the external connection terminal instead of the first solder bump 19a. Alternatively, the external connection terminal, such as the first solder bump 19a or the metallic pin, may not be provided. In such a case, when required, the external connection terminal may be formed on the first wiring layer 17a which is exposed to the opening 18x.

The second insulating layer 16b is formed on the bottom surface of the semiconductor chip 14 (or the surface on which the electrode pads (not illustrated) are not formed) and on the surface 13b of the substrate 13. Examples of the material of the second insulating layer 16b may include a resin material, such as an epoxy resin or a polyimide resin.

The second wiring layer 17b is formed on the second insulating layer 16b. The second wiring layer 17b formed in a third via hole 16z of the second insulating layer 16b is electrically connected to the end faces of various line conductors 12 which are exposed to the third via hole 16z. Namely, the second wiring layer 17b is electrically connected to the first wiring layer 17a through the various line conductors 12. For example, if the diameter of the bottom of the third via hole 16z is set to about 100 micrometers, the second wiring layer 17b would be electrically connected to the end faces of thousands of line conductors 12. In this case, the second wiring layer 17b is electrically connected to the first wiring layer 17a through thousands of line conductors 12. Examples of the material of the second wiring layer 17b may include copper (Cu), etc.

The second solder resist layer 18b is formed on the second insulating layer 16b to cover the second wiring layer 17b. The second solder resist layer 18b has an opening 18y and a part of the second wiring layer 17b is exposed to the opening 18y.

The second solder bump 19b is formed on the second wiring layer 17b which is exposed to the opening 18y of the second solder resist layer 18b. Examples of the material of the second solder bump 19b may include an alloy containing Pb, an alloy of Sn and Cu, an alloy of Sn and Ag, an alloy of Sn, Ag and Cu, etc. The second solder bump 19b serves as an external connection terminal which is connected to the mother board or the like.

Alternatively, a metallic pin or the like may be used as the external connection terminal instead of the second solder bump 19b. Alternatively, the external connection terminal, such as the second solder bump 19b or the metallic pin, may not be provided. In such a case, when required, the external connection terminal may be formed on the second wiring layer 17b which is exposed to the opening 18y.

Next, a method of manufacturing the semiconductor device of the first embodiment will be described. FIGS. 5-15 are diagrams for explaining a series of processes of manufacturing the semiconductor device of the first embodiment. In FIGS. 5-15, the elements which are the same as corresponding elements n of the semiconductor device 10 in FIG. 3 are designated by the same reference numerals, and a description thereof will be omitted.

Figure 5:
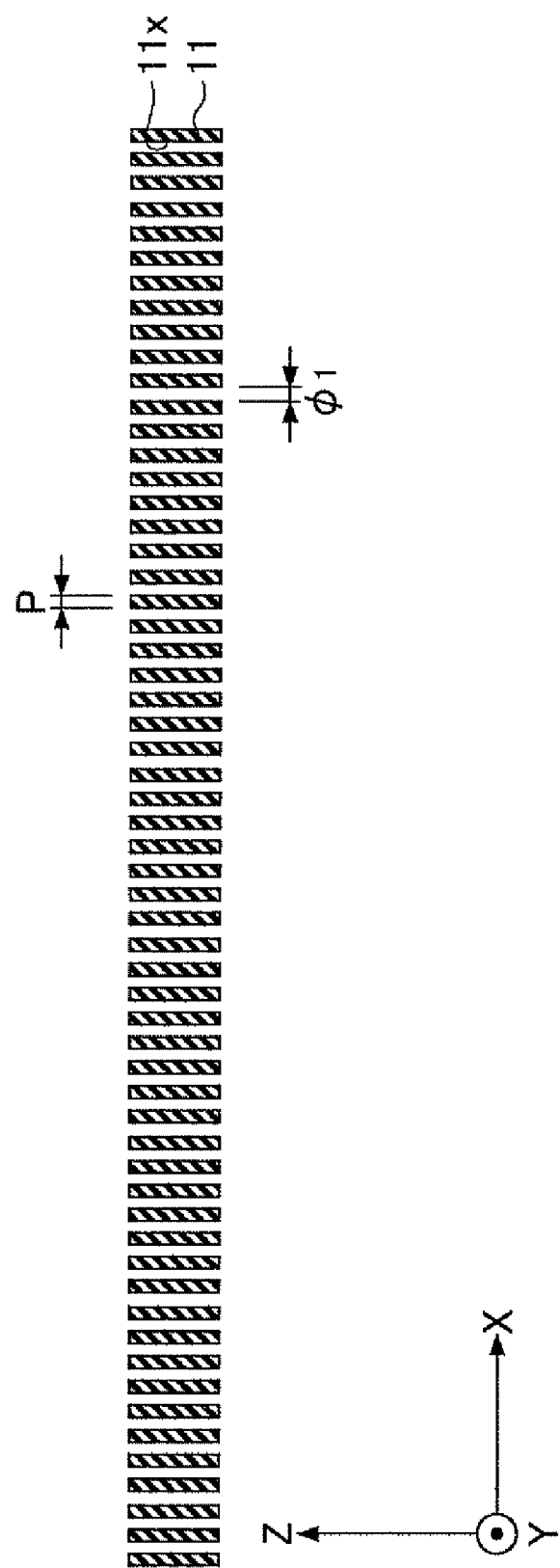
FIG. 5 is a diagram for explaining a manufacturing process of the semiconductor device of the first embodiment.

At the process illustrated in FIG. 5, an insulating base material 11 is prepared and a number of through holes 11x extending in the thickness direction are formed in the whole area of the prepared insulating base material 11. For example, a green sheet of alumina (aluminum oxide) having a thickness in a range of 70-100 micrometers and a size of about 10×10 mm may be used as the insulating base material 11. The through hole 11x may be formed to have a circular cross-section. In this case, the diameter $\phi 1$ of each through hole 11x is in a range of 30 nm-2000 nm. It is preferred that a number of through holes 11x are densely formed to make the spacing P between two adjacent through holes 11x smaller than the diameter $\phi 1$ of each through hole 11x. However, the arrangement of the through holes 11x is not limited to a specific embodiment, and the through holes 11x may be arranged in a hexagonal formation or in a grid formation.

An exemplary method of forming the through holes 11x will now be described. For example, the through holes 11x may be formed by using an anode oxidation method. Specifically, either an aluminum substrate having one surface coated with an insulating material, or an aluminum electrode layer in which an electrode layer of aluminum (Al) is formed on a glass substrate by sputtering is prepared. The surface of the aluminum substrate or the aluminum electrode layer is cleaned and the aluminum substrate or the aluminum electrode layer is immersed in an electrolytic solution (preferably, a sulfuric acid solution). The immersed aluminum substrate or the immersed aluminum electrode layer is used as the anode, the platinum (Pt) electrode disposed opposite to the same is used as the cathode, and a pulsed voltage between the anode and the cathode is supplied. As a result, a porous metal oxide film (or an aluminum oxide film in which holes of minute diameters are regularly formed) is deposited on the surface of the aluminum substrate or the aluminum electrode layer.

Subsequently, a voltage whose potential is reverse to that of the anode oxidation is applied to the electrodes (the aluminum substrate or the aluminum electrode layer is used as the cathode and the platinum (Pt) electrode is used the anode), and the porous metal oxide film is separated from the aluminum substrate or the aluminum electrode layer. Thereby, it is possible to produce an insulating base material 11 in which a plurality of through holes 11x with a desired diameter (which is, for example, in a range of 30 nm-2000 nm) are formed with high density.

Examples of the material of the insulating base material 11 may include alumina (aluminum oxide), mullite, aluminum nitride, crystallized glass (a composite material of glass and ceramics), etc. The material of the insulating base material 11 is not limited to ceramics (inorganic material).

Alternatively, an organic resin (such as an epoxy resin, a polyimide resin, etc.) may be used as the material of the insulating base material 11. However, when an organic resin (an epoxy resin, a polyimide resin, etc.) is used, it is desirable that the organic resin is mixed with an inorganic filler, such as silica, with high density. The first insulating layer 16a and the second insulating layer 16b use a similar organic resin with a coefficient of thermal expansion (CTE) nearly equal to that of the organic resin of the insulating base material 11. Therefore, the CTE of the resin used for the insulating base material 11 is lowered by mixing the inorganic filler, such as silica, with high density. Thereby, an intermediate value of the CTE of the insulating base material 11 between the value of the CTE of the semiconductor chip 14 and the value of the CTE of the first wiring layer 17a or the second wiring layer 17b is secured.

When an organic resin (such as an epoxy resin, a polyimide resin, etc.) is used for the insulating base material 11, the through holes 11x may be formed by a laser cutting process using a $CO_2$ gas laser, an excimer laser, etc.

Figure 6:
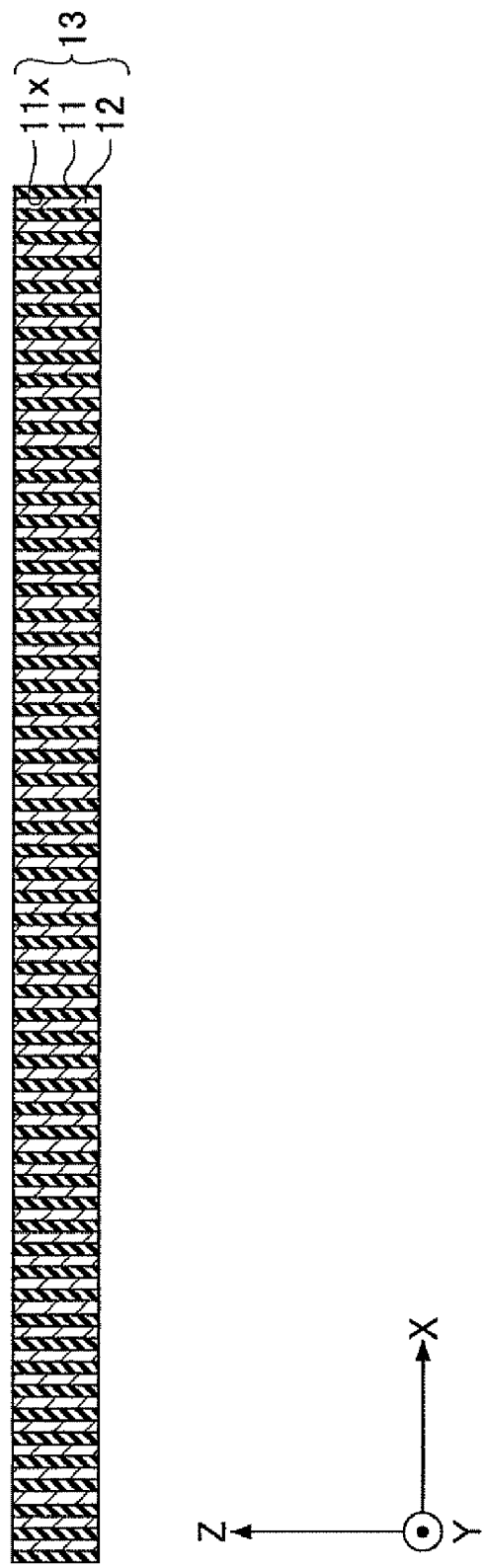
FIG. 6 is a diagram for explaining a manufacturing process of the semiconductor device of the first embodiment.

Subsequently, at the process illustrated in FIG. 6, the through holes 11x formed in the insulating base material 11 are filled with a metallic material to form the line conductors (vias) 12. In the following, the insulating base material 11 having the line conductors 12 formed therein will be referred to as the substrate 13. The line conductors 12 may be formed by filling the through holes 11x with a conductive paste, such as silver (Ag) or copper (Cu), by using a screen printing process, an ink jet printing process, etc. When an organic resin (such as an epoxy resin, a polyimide resin, etc.) is used for the insulating base material 11, the through holes 11x may be filled with a metallic material, such as copper (Cu) or nickel (nickel), by using an electroplating process.

For example, when copper (Cu) is used as the metallic material, the through holes 11x may be filled with copper (Cu) by using the electrolytic copper (Cu) plating process in which the seed layer is formed on the surface of the insulating base material 11 (including the surfaces of the inner walls of the through holes 11x) by electroless copper plating and the formed seed layer is used as an electricity supply layer. Alternatively, the through holes 11x may be filled with copper (Cu) by using electroless copper plating only.

When required, both the surfaces of the substrate 13 may be ground to form flat surfaces by mechanical polishing, chemical mechanical polishing (CMP), etc. so that the ends of each line conductor 12 can be exposed to both the top and bottom surfaces of the insulating base material 11. In this manner, the structure (see FIG. 6) in which the line conductors 12 of the desired diameter which penetrate the insulating base material 11 in the thickness direction are formed in the insulating base material 11 with high density.

Figure 7:
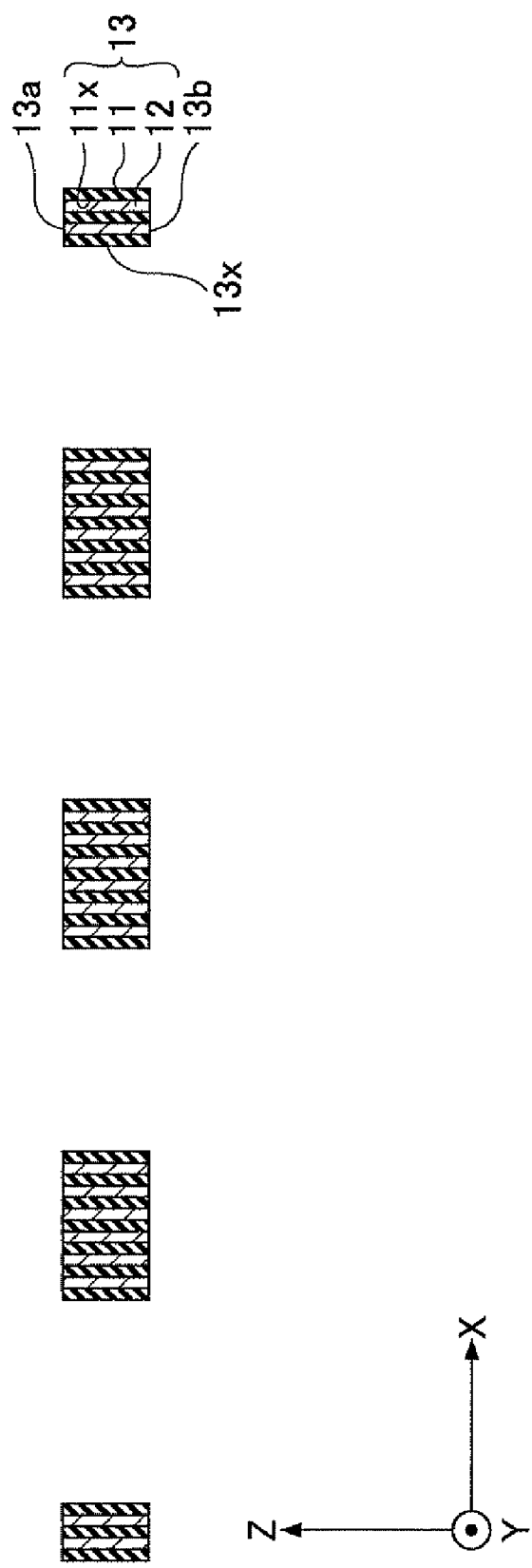
FIG. 7 is a diagram for explaining a manufacturing process of the semiconductor device of the first embodiment.

Subsequently, at the process illustrated in FIG. 7, the through holes 13x are formed in the substrate 13 formed in FIG. 6. Each through hole 13x is used as a semiconductor chip accommodating hole in which the semiconductor chip 14 is mounted at the process illustrated in FIG. 9 which will be described later. The configuration of each through hole 13x may be suitably determined to be in conformity with the configuration of each semiconductor chip 14. For example, a rectangular parallelepiped configuration may be used as the configuration of each through hole 13x. For example, the through holes 13x may be formed by using a laser cutting process, a wet etching process, etc.

Figure 8:
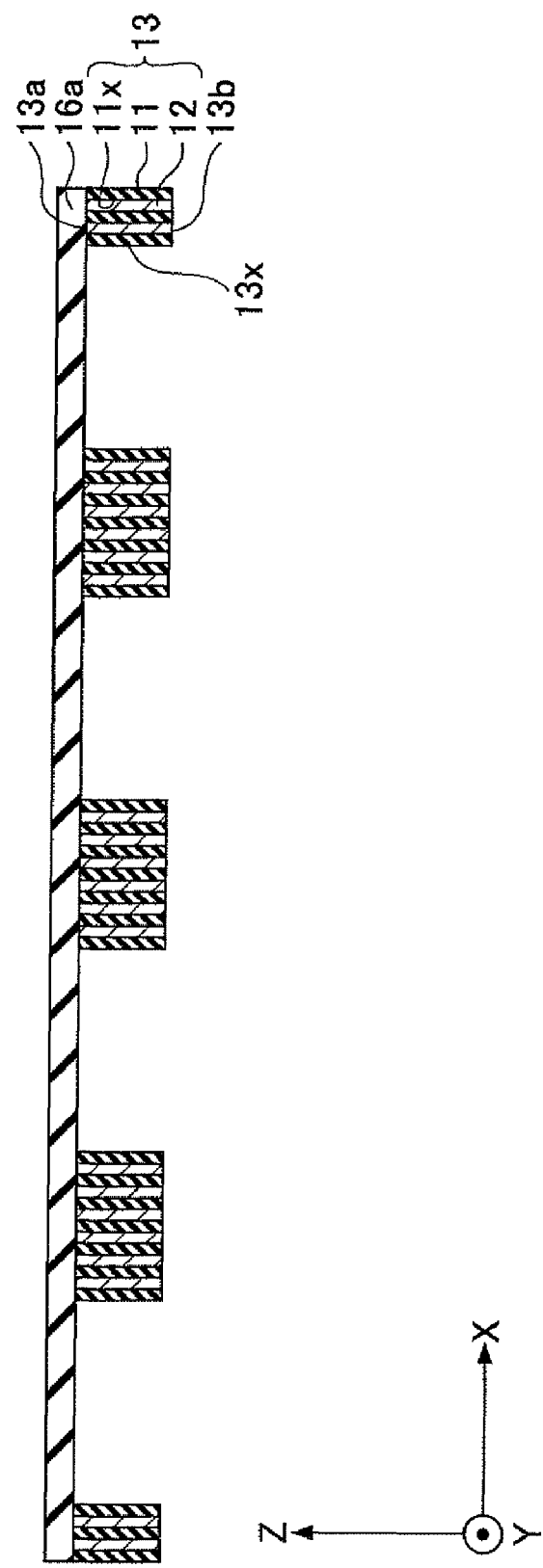
FIG. 8 is a diagram for explaining a manufacturing process of the semiconductor device of the first embodiment.

Subsequently, at the process illustrated in FIG. 8, the first insulating layer 16a is formed on the surface 13a of the substrate 13 to block one end of each through hole 13x. Examples of the material of the first insulating layer 16a may include a resin material, such as an epoxy resin or a polyimide resin. However, it is preferred that a resin material which is excellent in the homogeneity of the filler-contained thickness and in the workability is used as the material of the first insulating layer 16a. For example, the first insulating layer 16a is formed as follows. After a resin film is laminated on the surface 13a of the substrate 13 to block one end of each through hole 13x, the resin film is pressed on the surface, and thereafter it is heat-treated at a temperature of about 190 degrees C. to harden the resin film.

Figure 9:
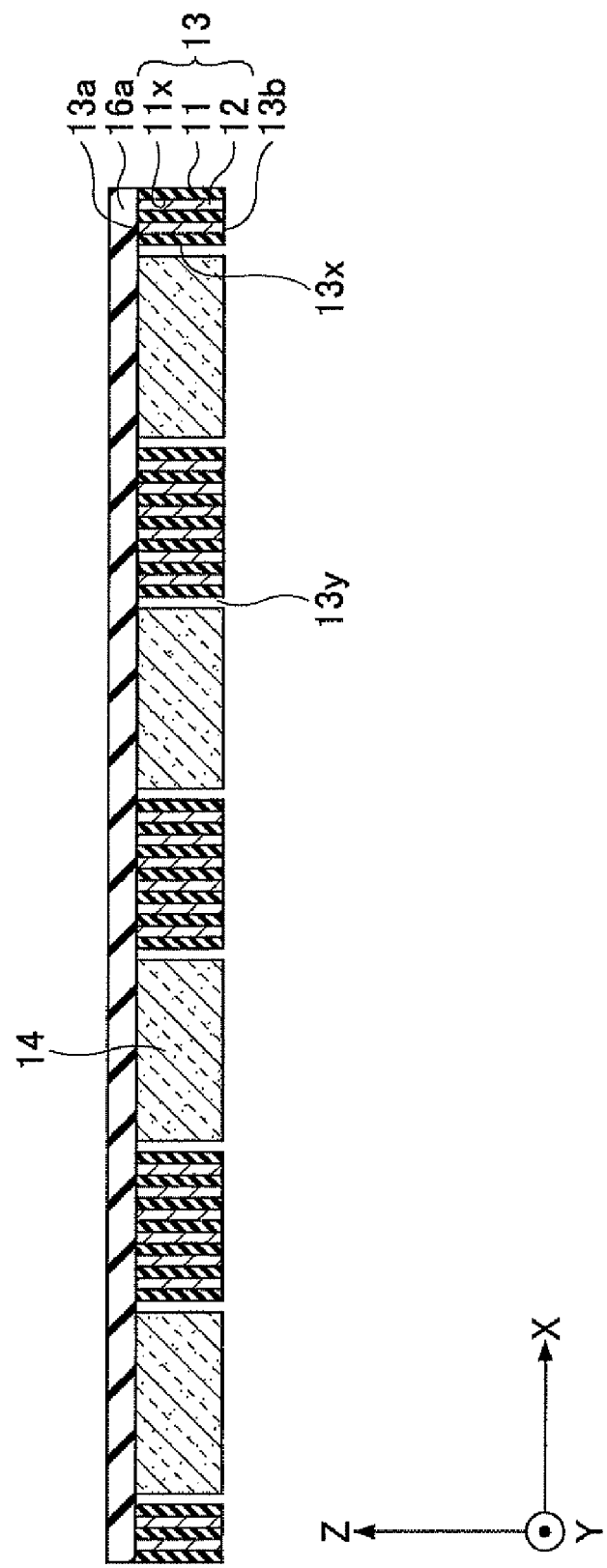
FIG. 9 is a diagram for explaining a manufacturing process of the semiconductor device of the first embodiment.

Subsequently, at the process illustrated in FIG. 9, the semiconductor chips 14 are sequentially mounted in the through holes 13x one by one. In this embodiment, each semiconductor chip 14 is arranged so that the surface of the semiconductor chip 14 (or the surface on which the electrode pads (not illustrated) are formed) is in contact with the first insulating layer 16a. The semiconductor chips 14 are arranged to form a spacing 13y between the side of each semiconductor chip 14 and the surface of the inside walls of each through hole 13x. The thickness of each semiconductor chip 14 may be in a range of 10-50 micrometers. However, the thickness of each semiconductor chip 14 may be equal to or slightly larger than the thickness (in a range of 70-100 micrometers) of the substrate 13. Each semiconductor chip 14 is a module in which a semiconductor integrated circuit (not illustrated) and electrode pads (not illustrated) are formed on a thinned semiconductor substrate (not illustrated) of silicon or the like.

Figure 10:
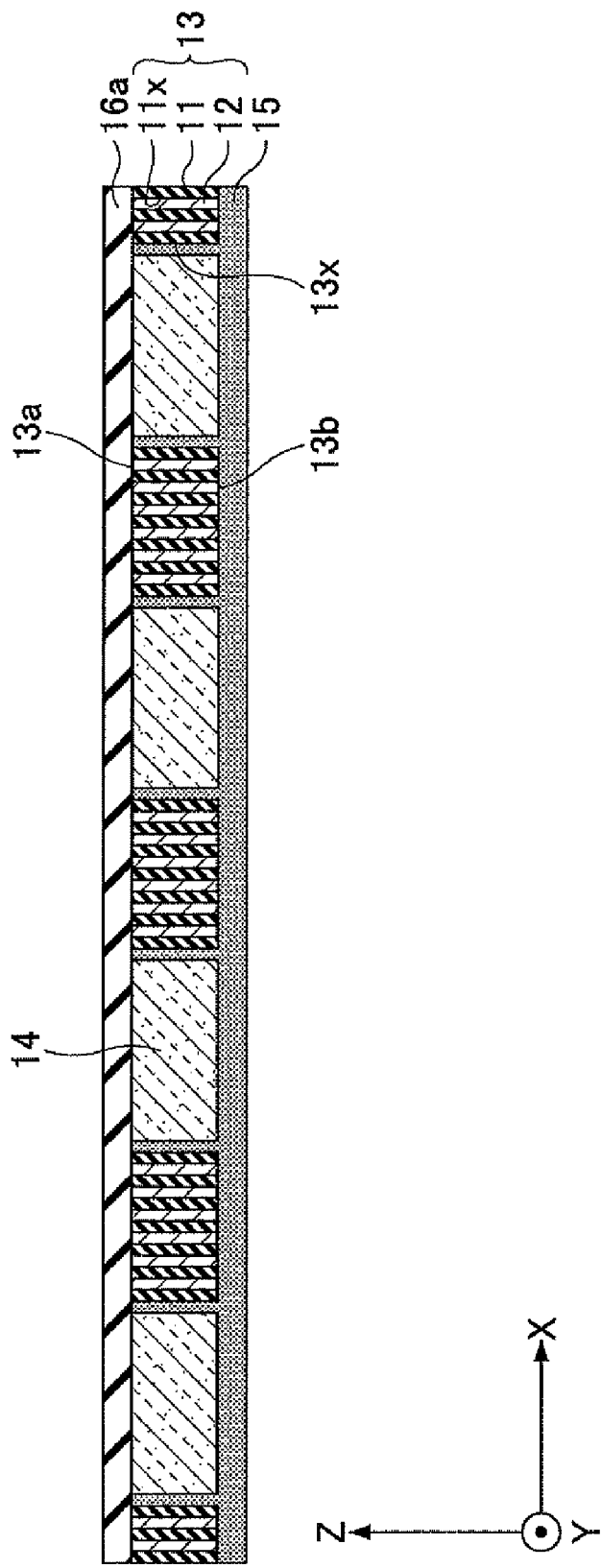
FIG. 10 is a diagram for explaining a manufacturing process of the semiconductor device of the first embodiment.

Subsequently, at the process illustrated in FIG. 10, the insulating resin 15 (an epoxy resin, a polyimide resin, etc.) is inserted in the spacings 13y and applied to the surface 13b of the substrate 13, and then hardened, so that the semiconductor chips 14 are stuck on the first insulating layer 16a and secured in the through holes 13x. It is preferred that a resin material which is excellent in the space filling characteristic, rather than the homogeneity of the thickness and the workability, is used as a material of the insulating resin 15.

Figure 11:
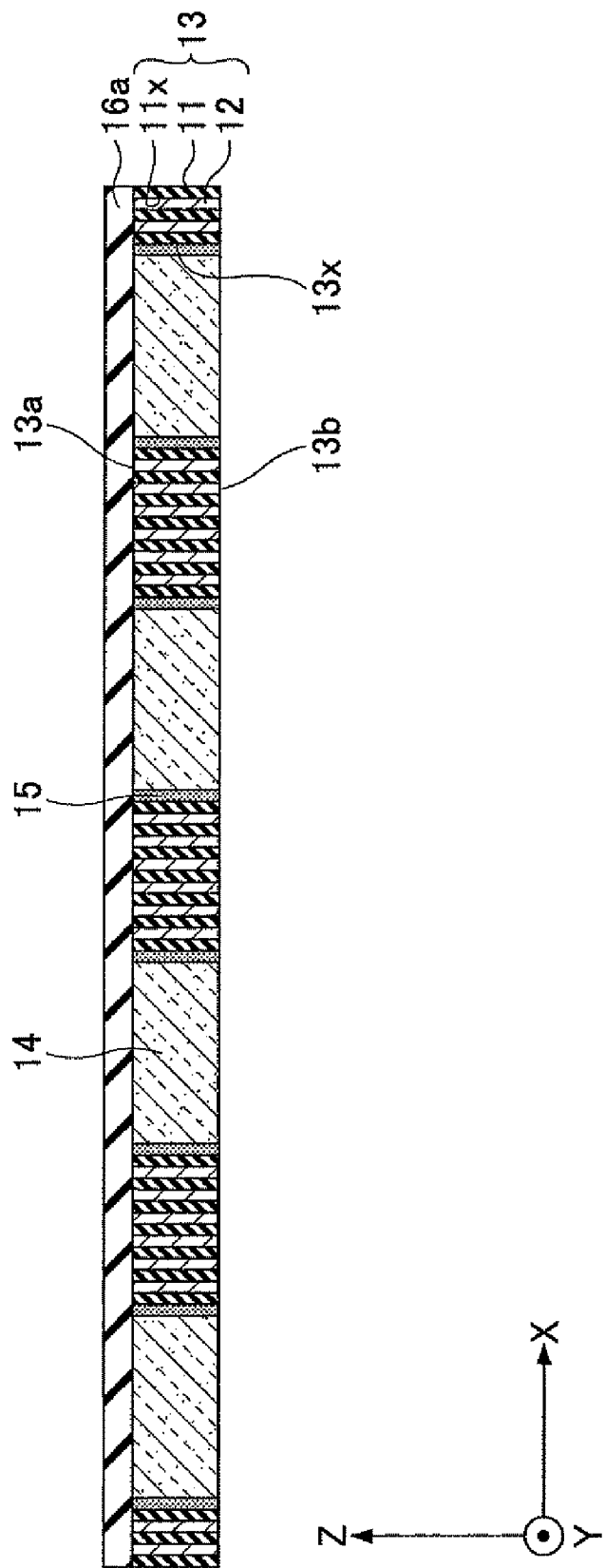
FIG. 11 is a diagram for explaining a manufacturing process of the semiconductor device of the first embodiment.

Subsequently, at the process illustrated in FIG. 11, the insulating resin 15 formed on the surface 13b of the substrate 13 is removed by mechanical polishing, chemical mechanical polishing (CMP), etc., so that the surface 13b of the substrate 13 is exposed. Alternatively, when the thickness of the semiconductor chip 14 is smaller than the thickness of the substrate 13, the insulating resin 15 formed on the bottom surface of the semiconductor chip 14 (or the surface which does not touch the first insulating layer 16a) may be left unpolished.

Figure 12:
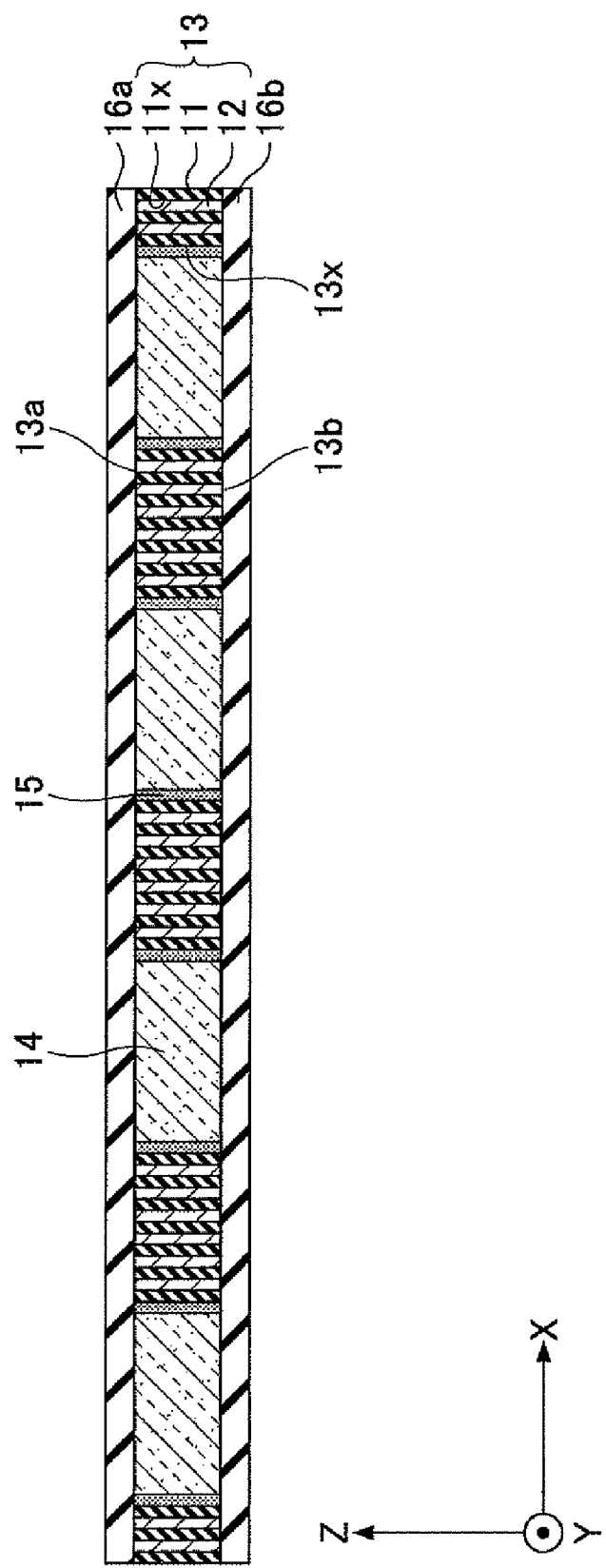
FIG. 12 is a diagram for explaining a manufacturing process of the semiconductor device of the first embodiment.

Subsequently, at the process illustrated in FIG. 12, the second insulating layer 16b is formed on the surface 13b of the substrate 13 and on the bottom surfaces of the semiconductor chips 14 (or on the insulating resin 15 formed on the bottom surfaces of the semiconductor chips 14). Namely, the second insulating layer 16b is formed to block the other end of each through hole 13x. Examples of the material of the second insulating layer 16b may include a resin material, such as an epoxy resin or a polyimide resin. However, it is preferred that a resin material which is excellent in the homogeneity of the filler-contained thickness and the workability is used as a material of the second insulating layer 16b. In view of the design of electrical properties, it is preferred that the material of the second insulating layer 16b used is the same as the material of the first insulating layer 16a used. For example, the second insulating layer 16b is formed as follows. After a resin film is laminated on the bottom surfaces of the semiconductor chips 14 (or on the insulating resin 15 formed on the bottom surfaces of the semiconductor chips 14) and on the surface 13b of the substrate 13, the resin film is pressed on the surface, and thereafter it is heat treated at a temperature of about 190 degrees C. to harden the resin film.

Figure 13:
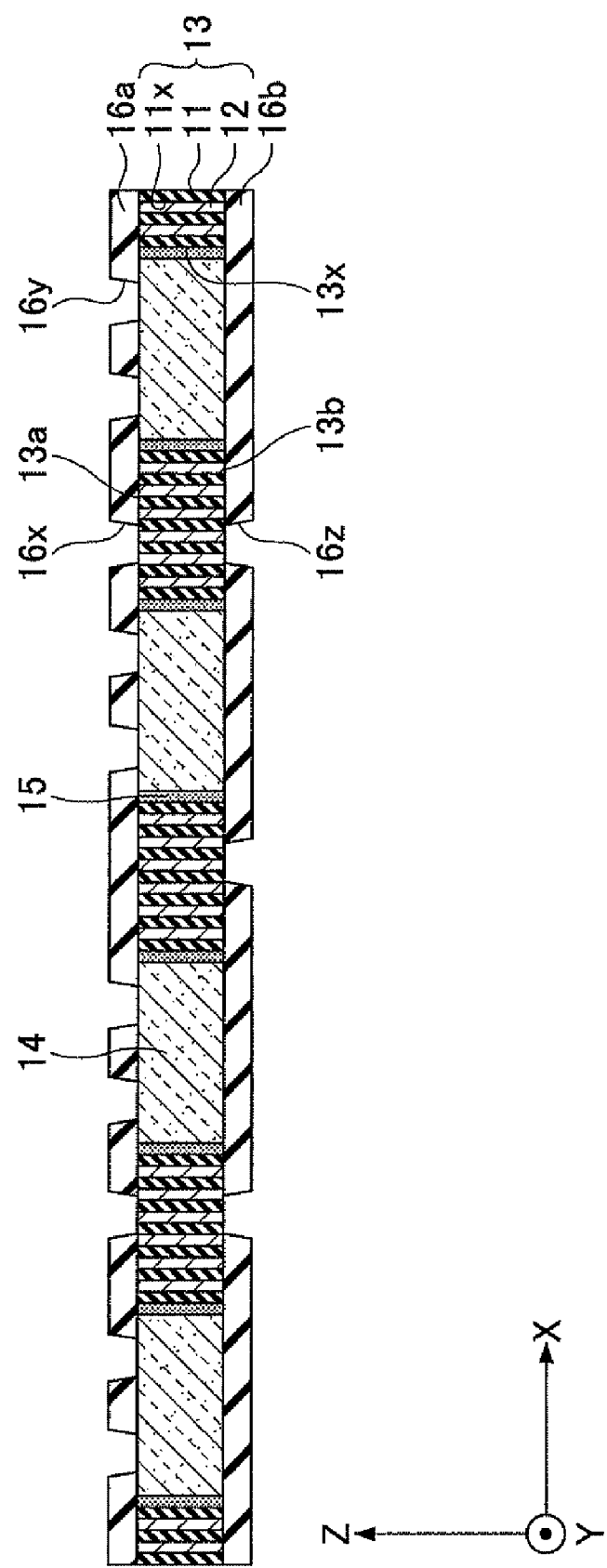
FIG. 13 is a diagram for explaining a manufacturing process of the semiconductor device of the first embodiment.

Subsequently, at the process illustrated in FIG. 13, a laser cutting process or the like is applied to the first insulating layer 16a. By the laser cutting, the first via holes 16x that penetrate the first insulating layer 16a are formed so that the surface 13a of the substrate 13 is exposed, and the second via holes 16y that penetrate the first insulating layer 16a are formed so that the electrode pads (not illustrated) of the semiconductor chip 14 are exposed. Furthermore, a laser cutting process or the like is applied to the second insulating layer 16b. By the laser cutting, the third via holes 16z that penetrate the second insulating layer 16b are formed so that the surface 13b of the substrate 13 is partially exposed. Therefore, one end surface of some of the line conductors 12 is exposed to the first via holes 16x and the other end surface of such line conductors 12 is exposed to the third via holes 16z (see FIG. 4).

A photolithographic process may be used to form the first via holes 16x such that a photopolymer film is used as the first insulating layer 16a and the second insulating layer 16b and patterning is performed with the photopolymer film. Alternatively, a screen printing process may be used to form holes in a resin film such that patterning is formed with the resin film and the first via holes 16x and others are formed.

Figure 14:
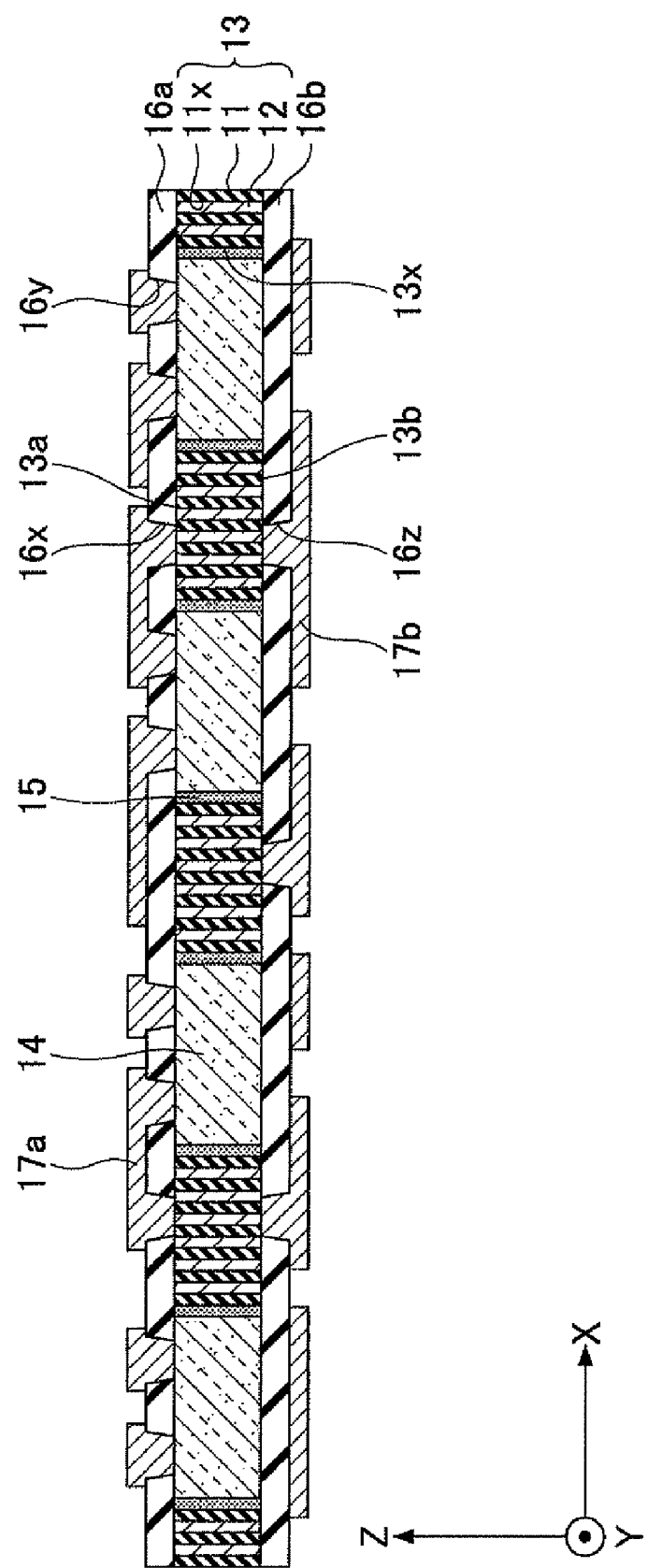
FIG. 14 is a diagram for explaining a manufacturing process of the semiconductor device of the first embodiment.

Subsequently, at the process illustrated in FIG. 14, the first wiring layer 17a which is electrically connected to both the end surfaces of the line conductors 12 exposed to the first via hole 16x and the electrode pads (not illustrated) of each semiconductor chip 14 exposed to the second via hole 16y is formed on the first insulating layer 16a. Furthermore, the second wiring layer 17b which is electrically connected to the end surfaces of the line conductors 12 exposed to the third via hole 16z is formed on the second insulating layer 16b. Thereby, the first wiring layer 17a and the second wiring layer 17b are electrically connected to the line conductors 12. Examples of the material of the first wiring layer 17a and the second wiring layer 17b may include copper (Cu) etc. For example, the first wiring layer 17a and the second wiring layer 17b may be formed by a semi-additive process.

An exemplary method of forming the first wiring layer 17a by the semi-additive process will now be described. First, by electroless plating or sputtering, a copper (Cu) seed layer (not illustrated) is formed in the first via hole 16x and the second via hole 16y, on the surface 13a of the substrate 13 and on the electrode pads (not illustrated) of the semiconductor chip 14. Next, a resist layer (not illustrated) including an opening corresponding to the first wiring layer 17a is formed. Subsequently, electrolysis electroplating is performed by using the copper seed layer as the electric supply layer, so that a copper (Cu) layer pattern (not illustrated) is formed in the opening of the resist layer.

Subsequently, the resist layer is removed, and the copper layer pattern is used as a mask and etching of the copper seed layer is performed so that the first wiring layer 17a can be obtained. As a method of forming the first wiring layer 17a, various kinds of wiring formation methods, other than the semi-additive process mentioned above, such as a subtractive process, can be used. Similarly, the second wiring layer 17b may be formed by using the same method.

By repeating the processes which are the same as described above, additional insulating layers and additional wiring layers may be laminated on the first wiring layer 17a and on the second wiring layer 17b, so that a build-up wiring layer containing "n" layers (n is an integer above 1) may be formed.

Figure 15:
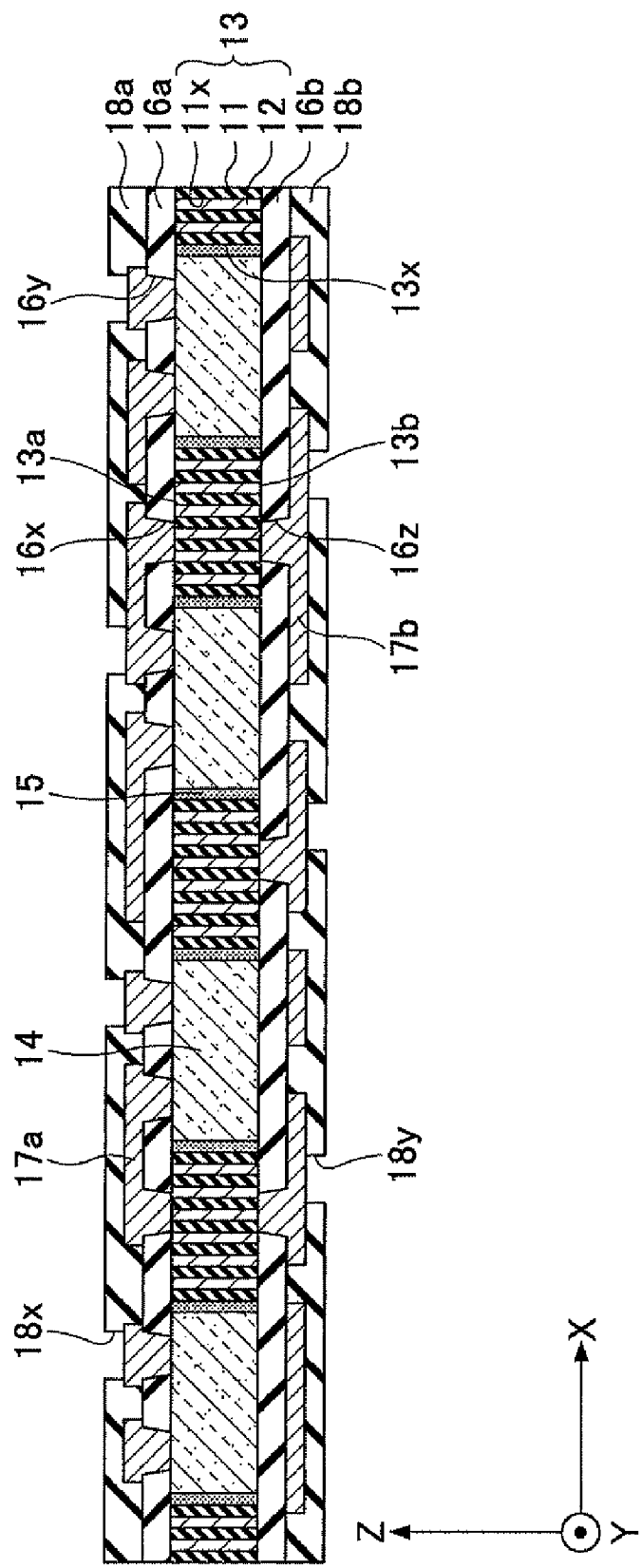
FIG. 15 is a diagram for explaining a manufacturing process of the semiconductor device of the first embodiment.

Subsequently, at the process illustrated in FIG. 15, the first solder resist layer 18a having the openings 18x is formed on the first insulating layer 16a to cover the first wiring layer 17a. Furthermore, the second solder resist layer 18b having the openings 18y is formed on the second insulating layer 16b to cover the second wiring layer 17b. For example, the first solder resist layer 18a having the openings 18x can be formed as follows. A solder-resist liquid is applied to cover the first wiring layer 17a, and the applied solder-resist liquid is exposed to light and developed so that the first solder resist layer 18a having the openings 18x is formed. The second solder resist layer 18b having the openings 18y may be formed by using the same method. As the material of the first solder resist layer 18a and the second solder resist layer 18b, a photosensitive resin composition containing an epoxy resin, a polyimide resin, etc., may be used.

A part of the first wiring layer 17a is exposed to the opening 18x of the first solder resist layer 18a. A part of the second wiring layer 17b is exposed to the opening 18y of the second solder resist layer 18b. For example, by electroless plating, a metal layer (not illustrated) may be formed on the first wiring layer 17a exposed to the opening 18x of the first solder resist layer 18a, and on the second wiring layer 17b exposed to the opening 18y of the second solder resist layer 18b.

Examples of the metal layer (not illustrated) may include an Au layer, an Ni/Au layer in which an Ni layer and an Au layer are laminated in this order, an Ni/Pt/Au layer in which an Ni layer, a Pt layer and an Au layer are laminated in this order, etc. Alternatively, instead of using the metal layer (not illustrated), an OSP (organic solderability preservative) process may be performed on the first wiring layer 17a exposed to the opening 18x of the first solder resist layer 18a, and on the second wiring layer 17b exposed to the opening 18y of the second solder resist layer 18b.

Subsequently, the first solder bumps 19a and the second solder bumps 19b are formed on the first wiring layer 17a exposed to the opening 18x of the first solder resist layer 18a and on the second wiring layer 17b exposed to the opening 18y of the second solder resist layer 18b, so that the semiconductor device 10 as illustrated in FIG. 3 is manufactured. For example, the first solder bumps 19a can be formed by printing a soldering paste to cover the first wiring layer 17a exposed to the opening 18x of the first solder resist layer 18a, and by performing a reflowing process of the soldering paste. The second solder bump 19b may be formed by using the same method. Examples of the material of the first solder bump 19a or the second solder bump 19b may include an alloy containing Pb, an alloy of Sn and Cu, an alloy of Sn and Ag, an alloy of Sn, Ag and Cu, etc. Both the first solder bump 19a and the second solder bump 19b serve as external connection terminals which are connected to the mother board or the like.

As an external connection terminal, a metallic pin or the like may be used instead of the first solder bump 19a and/or the second solder bump 19b. Alternatively, the external connection terminals, such as the first solder bumps 19a and/or the second solder bumps 19b, and the metallic pins, may not be provided. In this case, at the time of necessity (for example, at the time of shipment of the semiconductor device 10), the external connection terminals may be formed on the first wiring layer 17a exposed to the opening 18x and on the second wiring layer 17b exposed to the opening 18y of the second solder resist layer 18b.

In the first embodiment described above, the semiconductor device which contains a plurality of semiconductor chips has been illustrated. Alternatively, only a single semiconductor chip may be provided in the semiconductor device.

According to the first embodiment described above, a semiconductor chip is secured in one through hole of a substrate having through holes (or the insulating base material having the line conductors). The first insulating layer is formed on one surface of the substrate (or the insulating base material having the line conductors) and on the top surface of the semiconductor chip. The first wiring layer, which is electrically connected to some of the line conductors (which are exposed from one surface of the substrate) and the electrode pads of the semiconductor chip via the through hole (via hole) provided in the first insulating layer, is formed on the first insulating layer. The second insulating layer is formed on the other surface of the substrate (or the insulating base material having the line conductors) and on the bottom surface of the semiconductor chip. The second wiring layer, which is electrically connected to some of the line conductors (exposed from the other surface of the substrate) via the through hole (via hole) provided in the second insulating layer is formed on the second insulating layer.

Accordingly, the first wiring layer formed on one surface of the substrate (or the insulating base material having the line conductors), and the second wiring layer formed on the other surface of the substrate (or the insulating base material having the line conductors) can be electrically connected to the line conductors. Namely, in the semiconductor device of the first embodiment, the mutually connected wiring layers (the first wiring layer and the second wiring layer) can be formed on the top and bottom surfaces of a semiconductor chip, and it is possible to increase the packaging density.

In the semiconductor device of the first embodiment, the bumps are not used to electrically connect the semiconductor chip and the wiring layers (the first wiring layer and the second wiring layer), and it is possible to prevent occurrence of stress destruction due to the difference in the coefficient of thermal expansion between the semiconductor chip and the wiring layers (the first wiring layer and the second wiring layer) and prevent occurrence of disconnection due to electromigration, etc. It is possible to increase the reliability of connection of the semiconductor chip and the wiring layers (the first wiring layer and the second wiring layer).

Next, FIG. 16A and FIG. 16B are diagrams for explaining a modification of the semiconductor device of the first embodiment. FIG. 16A and FIG. 16B are a cross-sectional view and a plan view of a conductor in contact with one surface 13a of the substrate 13 and a conductor in contact with the other surface 13b of the substrate 13. In FIGS. 16A and 16B, the elements which are the same as corresponding elements of the semiconductor device 10 in FIG. 3 are designated by the same reference numerals, and a description thereof will be omitted.

In FIGS. 16A and 16B, the direction X indicates a direction which is parallel to one surface 13a of the substrate 13, the direction Y indicates a direction (or a width direction of the substrate 13) which is perpendicular to the direction X and parallel to one surface 13a of the substrate 13, and the direction Z indicates a direction (or a thickness direction of the substrate 13) which is perpendicular to both the direction X and the direction Y.

As illustrated in FIGS. 16A and 16B, the semiconductor device 10A of the modification of the first embodiment has a structure which is essentially the same as that of the semiconductor device 10 of the first embodiment but differs in the following two points. One point is that two GND patterns 17g1 and 17g2 are provided on the top and bottom surfaces 13a and 13b of the substrate 13. The other point is that the GND pattern 17g1 is connected through a fourth via hole 16g to a GND pattern 17g3 formed on the first insulating layer 16a.

In the following, a description will be given of only the points in which the semiconductor device 10A differs from the semiconductor device 10.

In the semiconductor device 10A, a predetermined signal current flows into each of the first wiring layer 17a in the first via hole 16x, the second wiring layer 17b in the third via hole 16z, and the line conductors 12 that connect the first wiring layer 17a and the second wiring layer 17b. As illustrated in FIG. 16B, the GND patterns 17g1 and 17g2 are formed with a predetermined spacing around the circumference of the portions where the first wiring layer 17a in the first via hole 16x and the second wiring layer 17b in the third via hole 16z are respectively in contact with the top surface 13a of the substrate 13 and the bottom surface 13b of the substrate 13. The GND pattern 17g1 and the GND pattern 17g2 are electrically connected to each other through the line conductors 12.

The GND pattern 17g1 is connected through the fourth via hole 16g to the GND pattern 17g3 formed on the first insulating layer 16a. Namely, each of the GND patterns 17g1-17g3 is the pattern grounded (or connected to GND (reference potential)). The GND pattern 17g1 is a part of the first wiring layer 17a.

For example, the GND patterns 17g1 and 17g2 may be formed on the surface 13a of the substrate 13 and the surface 13b of the substrate 13 by sputtering or electroplating. Examples of the material of the GND patterns 17g1 and 17g2 may include copper (Cu), etc.

As described in the foregoing, a plurality of line conductors 12 are formed in the substrate 13, and the line conductors 12 are connected to the GND patterns arranged with the predetermined spacing around the line conductors 12 to which the signal current flows. This structure is equivalent to a coaxial line structure, and the semiconductor device 10A according to the present disclosure can provide the shielding effect. The line conductors connected to GND are arranged between the neighboring line conductors to which the signal current flows, and it is possible to reduce the electrical coupling (capacity coupling) between the neighboring line conductors to which the signal current flows, and it is possible to prevent the line conductors to which the signal current flows from becoming a noise source.

Alternatively, a circular through hole may be formed in the circumference of the first via hole 16x of the first insulating layer 16a and the circumference of the third via hole 16z of the second insulating layer 16b, and the through hole may be filled with a conductive material, and such conductor may be connected to the GND patterns 17g1-17g3. The structure which is equivalent to the coaxial line structure formed in the substrate 13 is also formed in the first insulating layer 16a and the second insulating layer 16b. Therefore, the same effect can be provided.

As described in the foregoing, the semiconductor device of the modification of the first embodiment can provide the same effects as the first embodiment and can provide the following effects. Namely, the semiconductor device of the modification can provide the shielding effects by forming the structure equivalent to the coaxial line structure in the substrate. The semiconductor device of the modification of the first embodiment can reduce the electrical coupling (capacity coupling) between the neighboring line conductors to which the signal current flows, and can prevent the neighboring line conductors to which the signal current flows from becoming a noise source.

Figure 17:
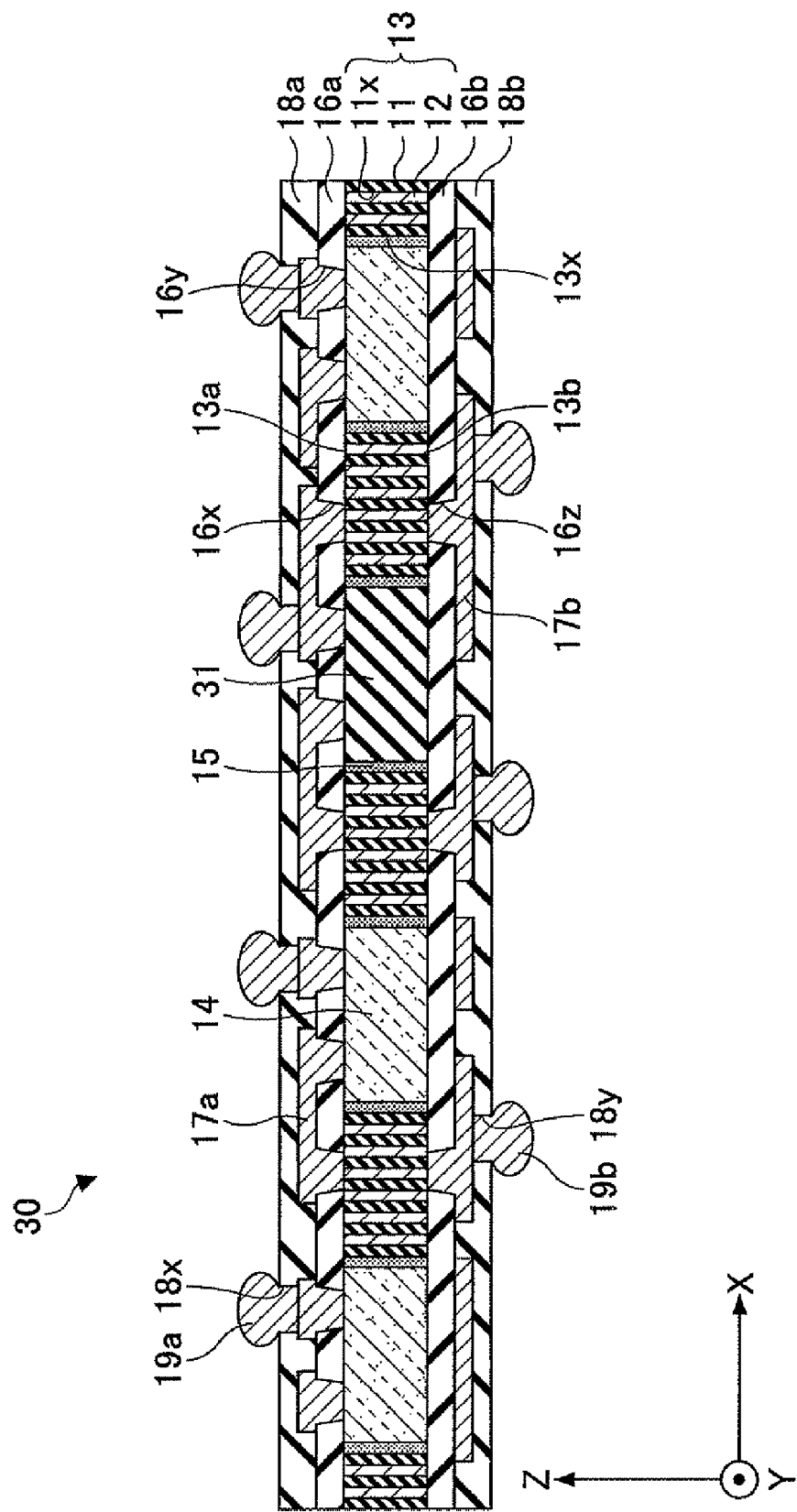
FIG. 17 is a cross-sectional view of a semiconductor device of a second embodiment of the present disclosure.

Next, FIG. 17 is a cross-sectional view of a semiconductor device of a second embodiment of the present disclosure. In FIG. 17, the elements which are the same as corresponding elements of the semiconductor device 10 in FIG. 3 are designated by the same reference numerals, and a description thereof will be omitted.

In FIG. 17, the direction X indicates a direction which is parallel to one surface 13a of the substrate 13, the direction Y indicates a direction (or a width direction of the substrate 13) which is perpendicular to the direction X and parallel to one surface 13a of the substrate 13, and the direction Z indicates a direction (or a thickness direction of the substrate 13) which is perpendicular to both the direction X and the direction Y.

As illustrated in FIG. 17, the semiconductor device 30 of the second embodiment has a structure which is essentially the same as that of the semiconductor device 10 of the first embodiment but differs in that one of a plurality of semiconductor chips 14 in the semiconductor device 10 is replaced by a passive component 31.

In the following, a description will be given of only the point in which the semiconductor device 30 of the second embodiment differs from the semiconductor device 10 of the first embodiment.

In the semiconductor device 30, the passive component 31 in one through hole 13x is any of a capacitor, a resistor, an inductor, etc. Alternatively, another passive component (for example, a capacitor, a resistor, etc.) may be arranged in another through hole 13x. Thus, the semiconductor device according to the present disclosure may be arranged to contain two or more semiconductor chips and two or more passive components.

The method of manufacturing the semiconductor device 30 of the second embodiment is essentially the same as the method of manufacturing the semiconductor device 10 of the first embodiment. The passive component 31 may be arranged in the through hole 13x at the process illustrated in FIG. 9.

As described in the foregoing, the semiconductor device of the second embodiment can provide the same effects as the first embodiment and can provide the following effects. Namely, the semiconductor device of the second embodiment can attain an advanced feature that semiconductor chips and passive components are built in a substrate.

Figure 18:
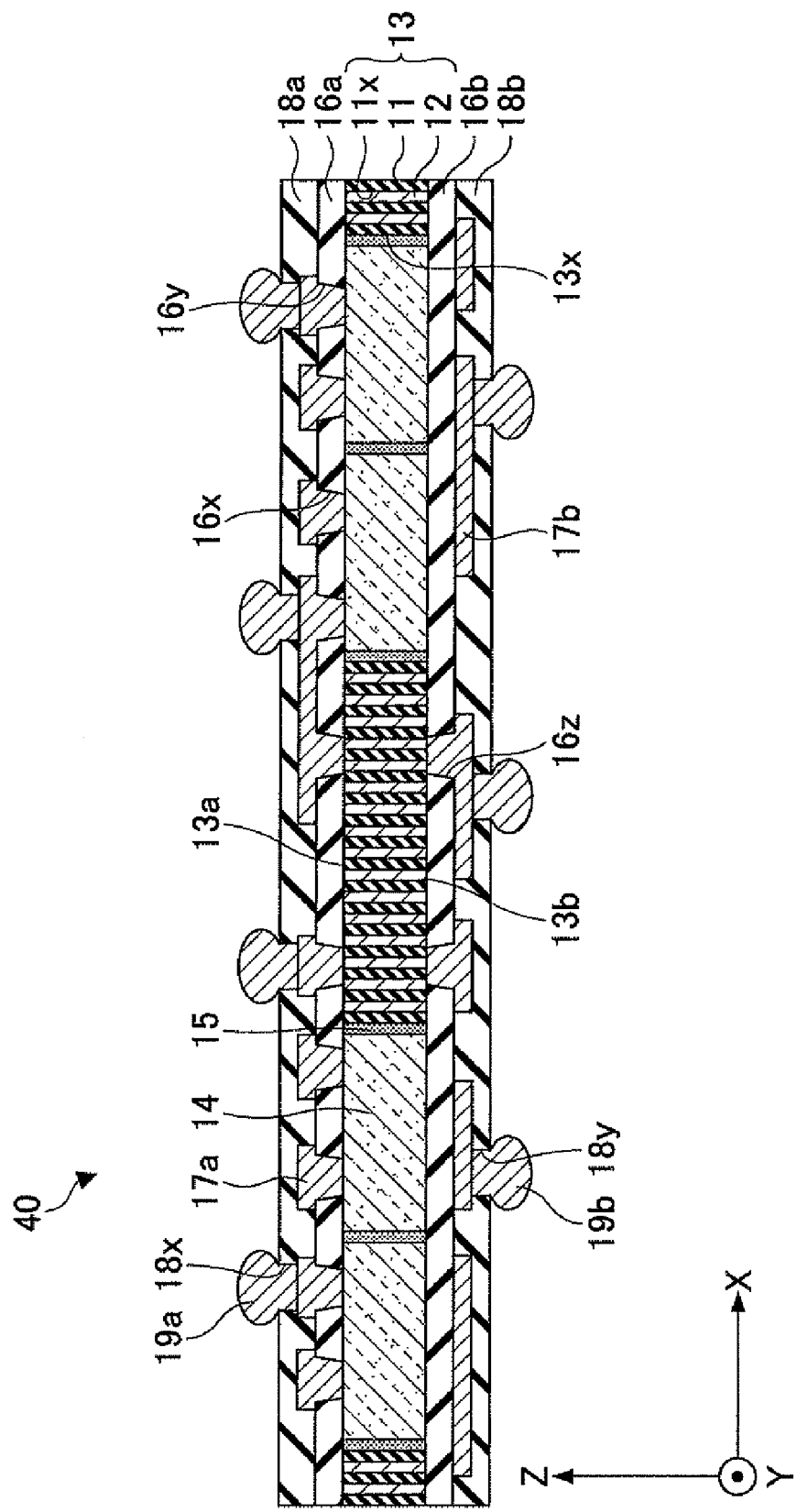
FIG. 18 is a cross-sectional view of a semiconductor device of a third embodiment of the present disclosure.

Next, FIG. 18 is a cross-sectional view of a semiconductor device of a third embodiment of the present disclosure. In FIG. 18, the elements which are the same as corresponding elements of the semiconductor device 10 in FIG. 3 are designated by the same reference numerals, and a description thereof will be omitted.

In FIG. 18, the direction X indicates a direction which is parallel to one surface 13a of the substrate 13, the direction Y indicates a direction (or a width direction of the substrate 13) which is perpendicular to the direction X and parallel to one surface 13a of the substrate 13, and the direction Z indicates a direction (or a thickness direction of the substrate 13) which is perpendicular to both the direction X and the direction Y.

As illustrated in FIG. 18, the semiconductor device 40 of the third embodiment has the structure which is essentially the same as that of the semiconductor device 10 of the first embodiment but differs in that two semiconductor chips 14 are arranged in one through hole 13x.

In the following, a description will be given of only the point in which the semiconductor device 40 of the third embodiment differs from the semiconductor device 10 of the first embodiment.

In the semiconductor device 40, each of the surfaces of the two semiconductor chips 14 in one through hole 13x (the surface on which the electrode pads (not illustrated) are formed) is arranged to be in contact with the first insulating layer 16a, and the semiconductor chips 14 are secured in the through hole 13x by the insulating resin 15. Thus, the semiconductor device according to the present disclosure may be arranged to have a plurality of semiconductor chips arranged in one through hole.

The method of manufacturing the semiconductor device 40 of the third embodiment is essentially the same as the method of manufacturing the semiconductor device 10 of the first embodiment. A plurality of semiconductor chips 14 may be arranged in one through hole 13x at the process illustrated in FIG. 9.

As described in the foregoing, the semiconductor device of the third embodiment can provide the same effects as the first embodiment and can provide the following effects. Namely, the semiconductor device of the third embodiment can provide an advanced feature that a plurality of semiconductor chips are built in one through hole of a substrate, and can increase the packaging density of the semiconductor device.

Figure 19:
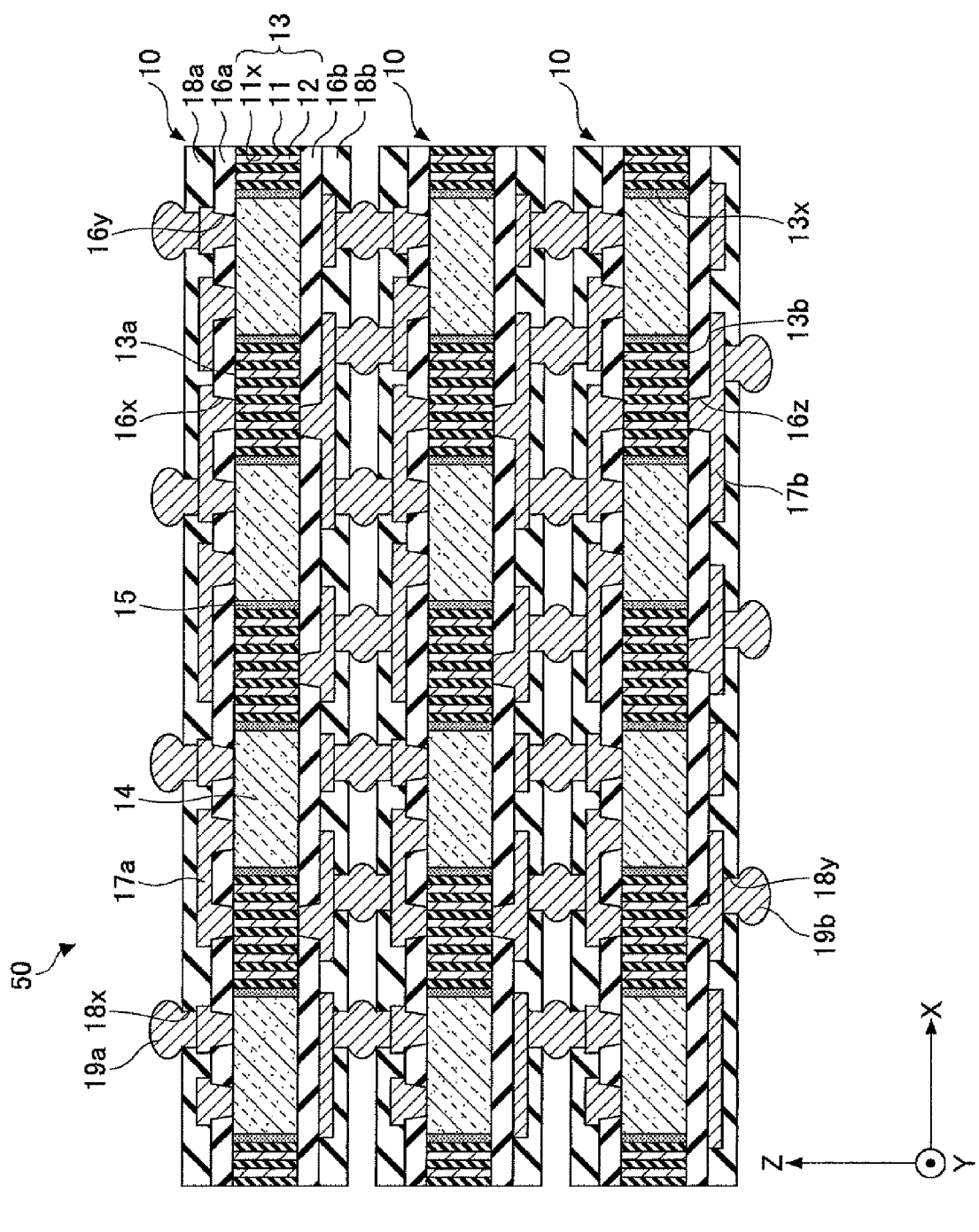
FIG. 19 is a cross-sectional view of a laminated type semiconductor device of a fourth embodiment of the present disclosure.

Next, FIG. 19 is a cross-sectional view of a laminated type semiconductor device of a fourth embodiment of the present disclosure. In FIG. 19, the elements which are the same as corresponding elements of the semiconductor device 10 in FIG. 3 are designated by the same reference numerals, and a description thereof will be omitted.

In FIG. 19, the direction X indicates a direction which is parallel to one surface 13a of the substrate 13, the direction Y indicates a direction (or a width direction of the substrate 13) which is perpendicular to the direction X and parallel to one surface 13a of the substrate 13, and the direction Z indicates a direction (or a thickness direction of the substrate 13) which is perpendicular to both the direction X and the direction Y.

As illustrated in FIG. 19, the laminated type semiconductor device 50 of the fourth embodiment has a structure in which a plurality of semiconductor devices 10 according to the present disclosure are laminated together.

In the following, a description will be given of only the point in which the laminated type semiconductor device 50 of the fourth embodiment differs from the semiconductor device 10 of the first embodiment.

In the laminated type semiconductor device 50, the three semiconductor devices 10 according to the present disclosure are laminated together and two adjacent semiconductor devices 10 are connected to each other by the first solder bumps 19a and the second solder bumps 19b which are respectively bonded together.

However, the number of semiconductor devices 10 to be laminated together is not limited to 3. Alternatively, two semiconductor devices 10 may be laminated together and four or more semiconductor devices 10 may be laminated together. Thus, according to the present disclosure, a plurality of semiconductor devices may be laminated together to form a laminated type semiconductor device.

The method of manufacturing the laminated type semiconductor device 50 of the fourth embodiment can be carried out by adding a process of laminating the two semiconductor devices 10, to the method of manufacturing the semiconductor device 10 of the first embodiment. The process of laminating the two semiconductor devices 10 can be carried out by using the known method.

As described in the foregoing, the semiconductor device of the fourth embodiment can provide the same effects as the first embodiment and can provide the following effects. Namely, the laminated type semiconductor device of the fourth embodiment can attain an advanced feature that a plurality of semiconductor devices according to the present disclosure are laminated together in a vertical direction, and can increase the packaging density of the semiconductor device.

According to the present disclosure, it is possible to provide a semiconductor device and a method of manufacturing a semiconductor device which are adapted to allow high reliability of the connection of a semiconductor chip and a substrate and high-density fabrication.

The present disclosure is not limited to the above-described embodiments, and variations and modifications may be made without departing from the scope of the invention. For example, modifications of the second through fourth embodiments similar to the above-described modification of the first embodiment may be made.

What is claimed is:

1. A semiconductor device comprising:
   a substrate having a plurality of line conductors which penetrate the substrate from a top surface of the substrate to a bottom surface of the substrate;
   a semiconductor chip secured in a semiconductor-chip accommodating hole of the substrate;
   a first insulating layer formed on the top surface of the substrate and on a top surface of the semiconductor chip;
   a first wiring layer formed on the first insulating layer, the first wiring layer in a first through hole of the first insulating layer being electrically connected to the semiconductor chip, and the first wiring layer in a second through hole of the first insulating layer being electrically connected to some of the plurality of line conductors exposed to the second through hole of the first insulating layer;
   a second insulating layer formed on the bottom surface of the substrate and on a bottom surface of the semiconductor chip; and
   a second wiring layer formed on the second insulating layer, the second wiring layer in a through hole of the second insulating layer being electrically connected to some of the plurality of line conductors exposed to the through hole of the second insulating layer.

2. The semiconductor device according to claim 1, wherein the plurality of line conductors are arranged so that a spacing between two adjacent line conductors of the plurality of line conductors is smaller than a diameter of each line conductor.

3. The semiconductor device according to claim 1, wherein the plurality of line conductors include an isolated line conductor which is electrically isolated from other line conductors.

4. The semiconductor device according to claim 1, wherein the plurality of line conductors include a first line conductor connected to a signal wiring line, and a second line conductor located in a peripheral area of the first line conductor, and the second line conductor is connected to a ground wiring line.

5. The semiconductor device according to claim 4, wherein an isolated line conductor which is electrically isolated from other line conductors is arranged between the first line conductor and the second line conductor.

6. The semiconductor device according to claim 1, wherein a plurality of the semiconductor chips are provided.

7. The semiconductor device according to claim 1, wherein the substrate includes a plurality of through holes formed therein and the plurality of through holes include a semiconductor chip accommodating hole for the semiconductor chip and a passive-component accommodating hole for a passive component.

8. The semiconductor device according to claim 1, wherein each of the plurality of line conductors has a diameter in a range of 30 nm-2000 nm.

9. A laminated type semiconductor device in which a plurality of the semiconductor devices according to claim 1 are laminated together.

10. A method of manufacturing a semiconductor device, comprising:
   preparing a substrate including a plurality of line conductors which penetrate the substrate from a top surface of the substrate to a bottom surface of the substrate;
   forming a semiconductor-chip accommodating hole in the substrate;
   forming a first insulating layer on a top surface of the substrate to block an end of the semiconductor-chip accommodating hole;
   securing a semiconductor chip in the semiconductor-chip accommodating hole so that a top surface of the semiconductor chip is in contact with the first insulating layer;
   forming a first wiring layer on the first insulating layer, the first wiring layer in a first through hole of the first insulating layer being electrically connected to the semiconductor chip, and the first wiring layer in a second through hole of the first insulating layer being electrically connected to some of the plurality of line conductors exposed to the second through hole of the first insulating layer;
   forming a second insulating layer on a bottom surface of the substrate to block the other end of the semiconductor-chip accommodating hole; and
   forming a second wiring layer on the second insulating layer, the second wiring layer in a through hole of the second insulating layer being electrically connected to some of the plurality of line conductors exposed to the through hole of the second insulating layer.

* * * * *